(12) United States Patent
Finkelstein et al.

(10) Patent No.: US 8,637,875 B2
(45) Date of Patent: Jan. 28, 2014

(54) SINGLE PHOTON IR DETECTORS AND THEIR INTEGRATION WITH SILICON DETECTORS

(75) Inventors: Hod Finkelstein, El Cerrito, CA (US); Sadik C. Esener, Solana Beach, CA (US); Yu-Hwa Lo, San Diego, CA (US); Kai Zhao, Fishkill, NY (US); James Cheng, La Jolla, CA (US); Sifang You, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 876 days.

(21) Appl. No.: 12/502,225

(22) Filed: Jul. 13, 2009

(65) Prior Publication Data
US 2013/0082286 A1 Apr. 4, 2013

Related U.S. Application Data

(60) Provisional application No. 61/080,172, filed on Jul. 11, 2008.

(51) Int. Cl.
*H01L 31/12* (2006.01)

(52) U.S. Cl.
USPC ............. 257/84; 257/184; 257/186; 257/438; 257/440; 257/603; 257/605; 257/606; 257/E29.335; 257/E31.063; 257/E31.064

(58) Field of Classification Search
USPC .......... 257/186, 438, 603, 605, 606, E29.335, 257/E31.063, E31.064, E31.116, 184, 440
See application file for complete search history.

(56) References Cited

U.S. PATENT DOCUMENTS

| | | | |
|---|---|---|---|
| 4,945,227 A | 7/1990 | Jones et al. | |
| 6,384,663 B2 | 5/2002 | Cova et al. | |
| 2003/0165207 A1 | 9/2003 | Noguchi et al. | |
| 2004/0106265 A1 | 6/2004 | Vickers | |
| 2005/0006678 A1* | 1/2005 | Tanaka et al. | 257/292 |
| 2005/0255649 A1 | 11/2005 | Augusto et al. | |
| 2006/0131480 A1 | 6/2006 | Charbon et al. | |
| 2008/0128631 A1 | 6/2008 | Suhami | |
| 2009/0065704 A1 | 3/2009 | Heringa et al. | |

FOREIGN PATENT DOCUMENTS

| | | |
|---|---|---|
| WO | WO 2007/127607 | 11/2007 |
| WO | WO 2008/011617 | 1/2008 |

OTHER PUBLICATIONS

Finkelstein et al. "Selected Topics in Quantum Electronics, IEEE Journal of; vol. 13 Issue 4; pp. 959-966".*
Zhao et al. "Lasers and Electro-optics SOciety, 2007.LEOS.2007. The 20th annual meeting of the IEEE; pp. 447-448".*

(Continued)

*Primary Examiner* — Ermias Woldegeorgis
(74) *Attorney, Agent, or Firm* — Perkins Coie LLP

(57) ABSTRACT

Apparatuses and systems for photon detection can include a first optical sensing structure structured to absorb light at a first optical wavelength; and a second optical sensing structure engaged with the first optical sensing structure to allow optical communication between the first and the second optical sensing structures. The second optical sensing structure can be structured to absorb light at a second optical wavelength longer than the first optical wavelength and to emit light at the first optical wavelength which is absorbed by the first optical sensing structure. Apparatuses and systems can include a bandgap grading region.

34 Claims, 20 Drawing Sheets

(56) References Cited

OTHER PUBLICATIONS

Alexis Rochas, Alexandre R Pauchard, Member, IEEE, Pierre-A Besse, Dragan Pantic, Member, IEEE, Zoran Prijic, Member, IEEE, and Rade S, Popovic, Member, IEEE, "Low-noise silicon Avalanche Photodiodes Fabricated in Conventional CMOS Technologies; IEEE Electronics devices vol. 49 No. 3, pp. 387-394".*
Akil et al., "Photon generation by silicon diodes in avalanche breakdown," *Appl. Phys. Lett.*, 73(7):871-872 (1998).
Albota et al., "Three-dimensional imaging laser radars with Geiger-mode avalanche photodiode arrays," *Lincoln Laboratory Journal*, 13(2):351-370 (2002).
Albota et al., "Photon-counting 1.55 µm optical communications with pulse-position modulation and a multimode upconversion single-photon receiver," *IEEE Lasers Electro-Optics Soc.*, 161-162 (2008).
Alon et al., "Circuits and Techniques for High-Resolution Measurement of On-Chip Power Supply Noise," *2004 Symposium on VLSI Circuits Digest of Technical Papers (IEEE Journal of Solid-State Circuits)*, 40(4):102-105 (2005).
Annunziata et al., "Superconducting niobium nanowire single photon detectors," presented at Advanced Photon Counting Techniques, Boston, MA (2006).
Aull et al., "Geiger-Mode Avalanche Photodiodes for Three-Dimensional Imaging," *Lincoln Laboratory Journal*, 13(2):335-350 (2002).
Becker, "High count rate multichannel TCSPC for optical tomography," *Proceedings of the SPIE*, 4431:249-254 (2001).
Becker, "Advanced Time-Correlated Single Photon Counting Techniques, Chapter 6: Detectors for Photon Counting," Berlin, Germany: Springer-Verlag, 213-261 (2005).
Ben-Michael et al,. "Afterpulsing in InGaAs/InP single photon avalanche photodetectors," *Digest of the LEOS Summer Topical Meetings*, 15-16 (2006).
Berland, "Detection of specific DNA sequences using dual-color two-photon fluorescence correlation spectroscopy," *Journal of Biotechnology*, 108:127-136 (2004).
Bethune et al., "A high-performance integrated single-photon detector for telecom wavelengths," *Journal of Modern Optics*, 51:1359-1368 (2004).
Bohmer, et al., "Time-resolved confocal scanning device for ultrasensitive fluorescence detection," *Rev. Sci. Instrum.*, 72(11):4145-4152 (2001).
Burkhard et al., "Optical properties of $In_{I-x} Ga_x P_{I-y} AS_y$, InP, GaAs, and GaP determined by ellipsometry," *J. Appl. Phys.*, 53(1):655-662 (1982).
Burkhard et al., "Dielectric functions and optical parameters of Si, Ge, GaP, GaAs, GaSb, InP, InAs, and InSb from 1.5 to 6.0 eV," *The Americal Physical Society*, 27(2):985-1009 (1983).
Chen et al., "Dual-color photon-counting histogram," *Biophysical Journal*, 88:2177-2192 (2005).
Cheng et al., "Self-Quenched InGaAs Single-Photon Detector," *University of California, San Diego*, 9 pages (Mar. 2009).
Chynoweth et al., "Photon emission from avalanche breakdown in silicon," *Physical Review*, 102:369-376 (1956).
Cova et al., "20-ps timing resolution with single-photon avalanche diodes," *Rev. Sci. Instrum.*, 60(6):1104-1110 (1989).
Cova et al., "High-accuracy picosecond characterization of gain-switched laser diodes," *Optics Letters*, 14(24):1341-1343 (1989).
Cova et al., "Avalanche photodiodes and quenching circuits for single-photon detection," *Applied Optics*, 35:1956-1976 (1996).
Cova et al., "Evolution and prospects for single-photon avalanche diodes and quenching circuits," *Journal of Modern Optics*, 51:1267-1288 (2004).
Cova et al., "Avalanche Diodes and Circuits for Infrared Photon Counting and Timing: Retrospect and Prospect," *Digest of the LEOS Summer Topical Meetings*, 25-28 (2006).
Donnelly et al., "1-mum geiger-mode detector development," *Proceedings of the SPIE*, 5791(1):286-292 (2005).
Finkelstein et al., "A compact single-photon avalanche diode in a deep-submicron CMOS technology," *Extended Abstracts of the 2006 International Conference of Solid-State Devices and Materials*, Sep. 13-15, 2006, Yokohama, Japan, 862-863, Abstract No. B-9-4 (2006).
Finkelstein et al., "STI-bounded single-photon avalanche diode in a deep-submicrometer CMOS technology," *IEEE Electron Device Letters*, 27(11):887-889 ( 2006).
Finkelstein et al., "An ultrafast Geiger-mode single-photon avalanche diode in 0.18-µm CMOS technology," *SPIE Adv. Photon Counting Tech.*, 6372 (2006).
Finkelstein et al., "Analysis of Hot-Carrier Luminescence for Infrared Single-Photon Upconversion and Readout," *IEEE Journal of Selected Topics in Quantum Electronics*, 13(4):959-966 (Jul./Aug. 2007).
Finkelstein et al., "Performance trade-offs in single-photon avalanche diode miniaturization," *Rev. Sci. Instrum.*, 78(10):103 (2007).
Finkelstein et al., "External electroluminescence measurements of InGaAs/InAIAs avalanche photodiodes," *Applied Physics Letters*, 91:243510 (2007).
Finkelstein, "Single-Photon Frequency Upconversion via Hot-Carrier Electroluminescence," Thesis/Chapter 5, *University of California, San Diego*, 34 pages (2007).
Finkelstein, "Ultrafast Silicon Single-Photon Avalanche Diodes in a Commercial 0.18 µm Technology," *Optoelectronics Computing Group/University of California, San Diego*, 22 pages. (Oct. 4, 2007).
Golovin et al., "Novel type of avalanche photodetector with Geiger mode operation," *Nucl. Instr. Meth. Phys. Res. A*, 518:560-564 (2004).
Gol'tsman et al., "Ultrafast superconducting single-photon detectors for near-infrared-wavelength quantum communications," *Phys. Stat. Sol. (c)*, 2(5):1480-1488 (2005).
Haitz, "Model for the electrical behavior of a microplasma," *Journal of Applied Physics*, 35(5):1370-1376 (1964).
Haitz, "Studies on optical coupling between silicon p-n junctions," *Solid State Electronics*, 8:417-425 (1965).
Heinze et al., "Simultaneous two-photon excitation of distinct labels for dual-color fluorescence cross-correlation analysis," *Proc. Natl. Acad. Sci. USA*, 97(19):10377-10382 (2000).
Hillesheim et al., "The Dual-Color Photon Counting Histogram with Non-Ideal Photodetectors," *Biophysical Journal*, 89:3491-3507 (2005).
Hiskett et al., "Performance and design of InGaAs/InP photodiodes for single-photon counting at 1.55 µm," *Applied Optics*, 39:6818-6829 (2000).
Hiskett et al, "Low-noise single-photon detection at wavelength 1.55 µm," *Electronics Letters*, 37(17):1081-1083 (2001).
Hsu et al., "A CMOS STI-Bound Single-Photon Avalanche Diode With 27-ps Timing Resolution and a Reduced Diffusion Tail," *IEEE Electron Device Letters*, 30(6):641-643 (2009).
Huang et al., "Counting efficiency of nuclear multiplate camera," *Chin. J Phys.*, 1:33-38 (1963).
Hurkx et al., "A New Recombination Model for Device Simulation Including Tunneling," *IEEE Transactions on Electron Devices*, 39:331-338 (1992).
International Search Report and Written Opinion for App. Ser. No. PCT/US07/74057, dated Feb. 19, 2008 (11 pages).
Kang et al., "InGaAs-on-Si single photon avalanche photodetectors," *Applied Physics Letters*, 85:1668-1670 (2004).
Kask et al., "Two-dimensional fluorescence intensity distribution analysis: theory and applications," *Biophysical Journal*, 78:1703-1713 (2000).
Kerman et al., "Superconducting nanowire photon-counting detectors for optical communications," *Lincoln Laboratory Journal*, 16:217-24 (2006).
Kettling et al., "Real-time enzyme kinetics monitored by dual-color fluorescence cross-correlation spectroscopy," *Proc. Natl. Acad. Sci. USA*, 95:1416-1420 (1998).
Kim et al., "Intracellular calmodulin availability accessed with two-photon cross-correlation," *Proc. Natl. Acad. Sci. USA*, 101:105-110 (2004).
Kurtsiefer et al., "The breakdown flash of silicon avalanche photodiodes-back door for eavesdropper attacks?," *Journal of Modern Optics*, 48:2039-2047 (2001).

(56) References Cited

OTHER PUBLICATIONS

Lacaita et al., "Observation of avalanche propagation by multiplication assisted diffusion in p-n junctions," *Applied Physics Letters*, 57:489-491 (1990).
Lacaita et al., "Strong dependence of time resolution on detector diameter in single proton avalanche diodes," *Electronics Letters*, 26(24):2053-2054 (1990).
Lacaita et al., "Single-photon avalanche diode with ultrafast pulse response free from slow tails," *IEEE Electron Device Lett.*, 14(7):360-362 (1993).
Lacaita et al., "On the Bremsstrahlung origin of hot-carrier-induced photons in silicon devices," *IEEE Trans. Electron Dev.*, 40:577-582 (1993).
Lacaita et al., "Photon-assisted avalanche spreading in reach-through photodiodes," *Appl. Phys. Lett.*, 62(6): 606-608 (1993).
Lahbabi et al., "Analysis of electroluminescence spectra of silicon and gallium arsenide p-n junctions in avalanche breakdown," *Journal of Applied Physics*, 95:1822-1828 (2004).
Langrock et al., "Highly efficient single-photon detection at communication wavelengths by use of upconversion in reverse-proton-exchanged periodically poled LiNbO3 waveguides," *Optics Letters*, 30:1725-1727 (2005).
Lee et al., "Low-power area-efficient high-speed I/O circuit techniques," *IEEE Journal of Solid-State Circuits*, 35(11):1591-1599 (2000).
Lin et al., "A protein biosensor using Geiger mode avalanche photodiodes," *Journal of Physics: Conference Series*,10:333-336 (2005).
Linga et al., "Solid State Photomultiplier: Noise Parameters of Photodetectors with Internal Discrete Amplification," *Proc. of SPIE*, 6119:143-152 (2006).
Lu et al., "Process Integration," Chapter 9 in *ULSI Technology*, C.Y. Chang and S.M. Sze, Editors, Singapore: The McGraw-Hill Companies, Inc., 472-529 (1996).
Maruyama et al., "Development of a near-infrared photon-counting system using an InGaAs avalanche photodiode," *Optical Engineering*, 41:395-402 (2002).
Marwick et al., "Single photon avalanche photodetector with integrated quenching fabricated in TSMC 0.18 μm 1.8 V CMOS process," *Electron. Lett.*, 44(10):643-644 (2008).
McIntyre, "A new look at impact ionization—Part I: A theory of gain, noise, breakdown probability, and frequency response," *IEEE Transactions on Electron Devices*, 46:1623-1631 (1999).
Mitchell et al., "Measurement of nanosecond time-resolved fluorescence with a directly gated interline CCD camera," *Journal of Microscopy*, 206(3):233-238 (2002).
Newman, "Visible light from a silicon p-n junction," *Physical Review*, 100:700-703 (1955).
Niclass et al., "A CMOS 3D Camera with Millimetric Depth Resolution," *IEEE Custom Integrated Circuits Conference (CICC)*, 705-708 (Oct. 2004).
Niclass et al., "Design and Characterization of a CMOS 3-D Image Sensor Based on Single Photon Avalanche Diodes," *IEEE J. of Solid-State Circuits*, 40(9):1847-1854 (2005).
Niclass et al., "CMOS imager based on single photon avalanche diodes," *IEEE Transducers '05: The 13th International Conference on Solid-State Sensors, Actuators and Microsystems*, Seoul, Korea, 1030-1034, Submission: 2E4.144 (Jun. 5-9, 2005).
Niclass et al., "A Single Photon Avalanche Diode Array Fabricated in Deep-Submicron CMOS Technology," *Proceedings of the Design, Automation and Test in Europe*, 1-6 (Mar. 6-10, 2006).
Niclass et al., "A single photon avalanche diode array fabricated in 0.35 μm CMOS and based on an event-driven readout for TCSPC experiments," presented at the 32nd Eur. Solid-State Circuit Conf., Montreux, Switzerland (2006).
Niclass et al., "A single photon avalanche diode implemented in 130-nm CMOS technology," *IEEE J. Sel. Topics Quantum Electron.*, 13(4):863-869 ( 2007).
Oldham et al., "Triggering Phenomena in Avalanche Diodes," *IEEE. Trans. Elect. Devices.*, 19(9):1056-1060 (1972).
Onsager, "Reciprocal Relations in Irreversible Processes. I.," *Physical Review*, 37:405-426 (1931).
Onsager, "Reciprocal Relations in Irreversible Processes. II.," *Physical Review*, 38:2265-2279 (1931).
Pellegrini et al., "Design and performance of an InGaAs-InP single-photon avalanche diode detector," *IEEE Journal of Quantum Electronics*, 42:397-403 (2006).
Ranjan et al, "Impact of Metal Overhang and Guard Ring techniques on Breakdown voltage of Si strip Sensors," *Proceedings of 2003 IEEE Nuclear Science Symposium*, 780-783 (2003).
Rech et al., "Photon-timing detector module for single-molecule spectroscopy with 60-ps resolution," *IEEE J. Sel. Top. Quantum Electron.*, 10(4):788-795 (2004).
Rhodes et al., "CMOS imager technology shrinks and image performance," *Proceedings of 2004 IEEE Workshop on Microelectronics and Electron Devices*, Boise, ID., 7-18 (2004).
Ribordy et al., "Photon counting at telecom wavelengths with commercial InGaAs/InP avalanche photodiodes: current performance," *Journal of Modern Optics*, 51:1381-1398 (2004).
Rochas et al., "Low-Noise Silicon Avalanche Photodiodes Fabricated in Conventional CMOS Technologies," *IEEE Transactions on Electron Devices*, 49(3):387-394 (2002).
Rochas et al., "First Passively-Quenched Single Photon Counting Avalanche Photodiode Element Integrated in a Conventional CMOS Process with 32ns Dead Time," Applications of Photonic Technology 5, R.A. Lessard, G. A. Lampropoulos, and G. W. Schinn, Editors, *Proceedings of SPIE*, 4833:107-115 (2002).
Rochas et al., "Single photon detector fabricated in a complementary metal-oxide-semiconductor high-voltage technology," *Rev. Sci. Instrum.*, 74(7):3263-3270 (2003).
Rochas et al., "Actively recharged single photon counting avalanche photodiode integrated in an industrial CMOS process," *Sensors and Actuators A*, 110:124-129 (2004).
Rochas et al., "Ultra-compact CMOS single photon detector," presented at Advanced Photon Counting Techniques, Boston, MA (2006).
Rosenberg et al., "Quantum key distribution at telecom wavelengths with noise-free detectors," *Applied Physics Letters*, 88:021108 (2006).
Sadygov et al., "Super-sensitive avalanche silicon photodiode with surface transfer of charge carriers," *Nuclear Instruments and Methods in Physics Research*, A504:301-303 (2003).
Schwille et al., "Dual-color fluorescence cross-correlation spectroscopy for multicomponent diffusional analysis in solution," *Biophysical Journal*, 72:1878-1886 (1997).
Shubin et al., "Multi-element avalanche photosensor," *SPIE*, 2415:94-103 (1995).
Shushakov et al., "New solid state photomultiplier," *Proc. SPIE*, 2397:544 (1995).
Spinelli et al., "Physics and numerical simulation of single photon avalanche diodes," *IEEE Trans. Electron Devices*, 44(11):1931-1943 (1997).
Spinelli et al., "Avalanche detector with ultraclean response for time-resolved photon counting," *IEEE J. Quantum Electron.*, 34(5):817-821 (1998).
Steen et al., "Timing high-speed microprocessor circuits using picosecond imaging circuit analysis," presented at High-Speed Imaging and Sequence Analysis III (2001).
Sze et al., "Effect of junction curvature on breakdown voltage in semiconductor," *Solid-State Electronics*, 9:831-845 (1966).
Sze et al., "Unit-cube expression for space-charger resistance," *The Bell System Technical Journal*, 46(5): 837-842 (1967).
Sze, "p-n Junction Diode," Chapter 2 in *Physics of Semiconductor Devices*, 2nd edition, John Wiley & Sons, 63-132 (1981).
Sze, "Photodetectors," Chapter 13, pp. 743-789, "Appendix H—Properties of Ge, Si and GaAs at 300 K," pp. 850-851, and "Appendix I-Properties of $SiO_2$ and $Si_3N_4$ at 300 K," p. 852 in *Physics of Semiconductor Devices*, 2nd edition, John Wiley & Sons (1981).
Takesue et al. "10 GHz clock differential phase shift quantum key distribution experiment," *Opt. Express*, 14(20):9522-9530 (2006).
Taylor et al., "Characterization of novel active area silicon avalanche photodiodes operating in the Geiger mode," *Journal of Modern Optics*, 51( 9-10):1323-1332 (2004).

(56) References Cited

OTHER PUBLICATIONS

Thew et al., "Low jitter up-conversion detectors for telecom wavelength GHz QKD," *New Journal of Physics*, 8:32 (2006).
Thews et al., "Cross Talk Free Fluorescence Cross Correlation Spectroscopy in Live Cells," *Biophysical Journal*, 89:2069-2076 (2005).
Tisa et al., "Variable-load quenching circuit for single-photon avalanche diodes," *Opt. Express*, 16(3):2232-2244 (2007).
Tisa et al., "Fully-integrated CMOS single photon counter," *Opt. Express*, 15(6):2873-2887 (2007).
Tremsin et al., "The Microsphere Plate: A New Type of Electron Multiplier," *Nuclear Instruments and Methods in Physics Research A*, 368:719-730 (1996).
Voldman et al., "Semiconductor Process and Structural Optimization of Shallow Trench Isolation-Defined and Polysilicon-Bound Source/Drain Diodes for ESD Networks," *Proceedings of the Electrical Overstress/Electrostatic Discharge Symposium Proceedings (EOS/ESD Symposium)*, Reno, Nevada, 98-151 to 98-160, Session 3A.1.1-3A.1.10 (Oct. 6-8, 1998).
Wei et al., "Low temperature glass-to-glass wafer bonding," *IEEE Transactions on Advanced Packaging*, 26:289-294 (2003).
Yamada et al., "Recombination radiation as possible mechanism of light-emission from reverse-biased p-n-junctions under breakdown condition," *Japanese Journal of Applied Physics Part I*, 32:4555-4559 (1993).
Yilmaz, "Optimization and surface charge sensitivity of high-voltage blocking structures with shallow junctions," *IEEE Trans. Electron Devices*, 38(7):1666-1675 (1991).
Zappa et al., "SPADA: Single-photon avalanche diode arrays," *IEEE Photonics Technology Letters*, 17:657-659 (2005).
Zhao et al., "Ultra Low Noise in GaAs Single Photon Detector with Transient Carrier Buffer," *LEOS 2007—IEEE Lasers and Electro-Optics Society Annual Meeting Conference Proceedings*, Lake Buena Vista, Florida, 447-448 (Oct. 21-Oct. 25, 2007).
Zhao et al., "InGaAs/InP MOS single photon detector," presented at Digest of the LEOS Summer Topical Meetings (2006).
Zhao et al., "InGaAs single photon avalanche detector with ultralow excess noise," *Applied Physics Letters*, 91:081107 (2007).
Zhao et al., "Self-quenching and self-recovering InGaAs/InAlAs single photon avalanche detector," *Applied Physics Letters*, 93:153504 (2008).
Zielinski et al., "Excitonic transitions and exciton damping processes in InGaAs/InP," *J. Appl. Phys.*, 59:2196 (1986).
U.S. Appl. No. 12/374,641, filed Feb. 4, 2009, entitled "Shallow-Trench-Isolation (STI)-Bounded Single-Photon CMOS Photodetector," 80 pages.

* cited by examiner

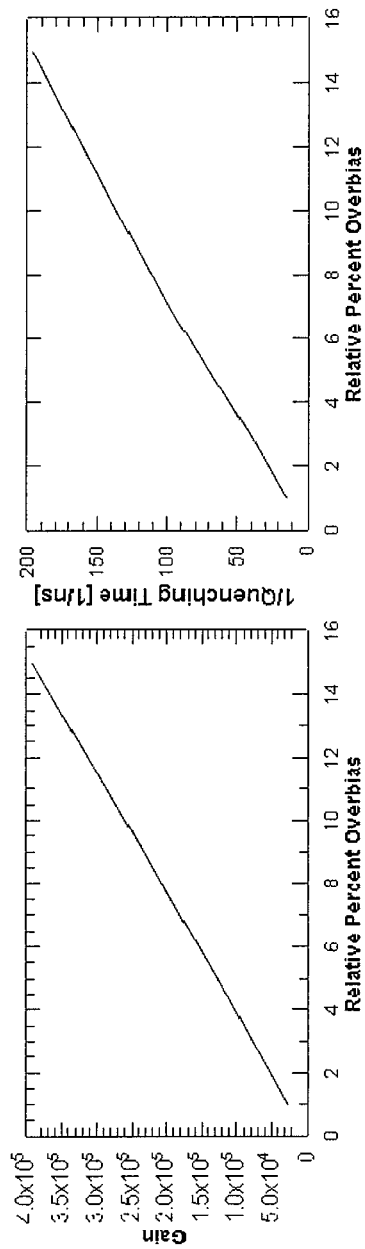
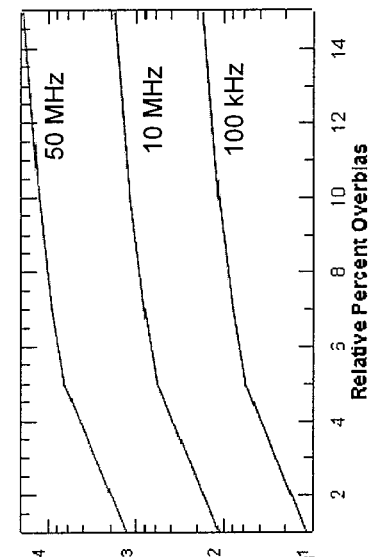
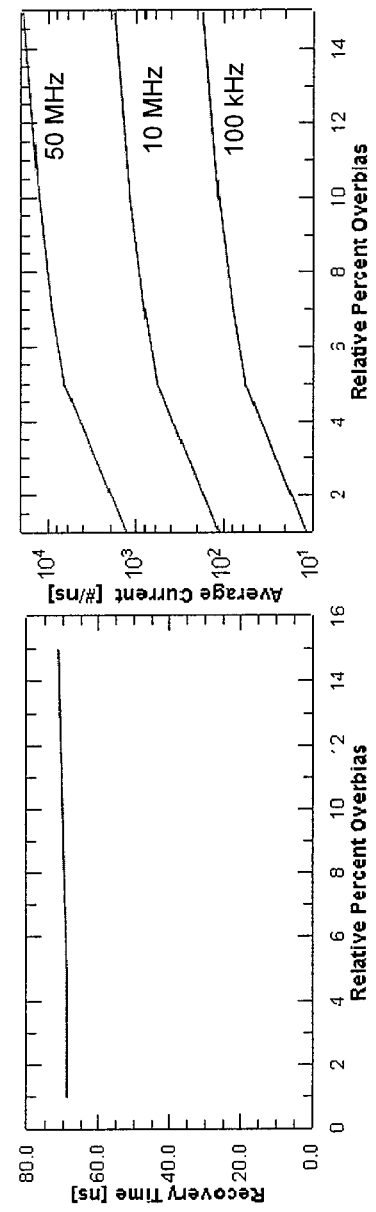
FIG. 13A
FIG. 13B
FIG. 13C
FIG. 13D

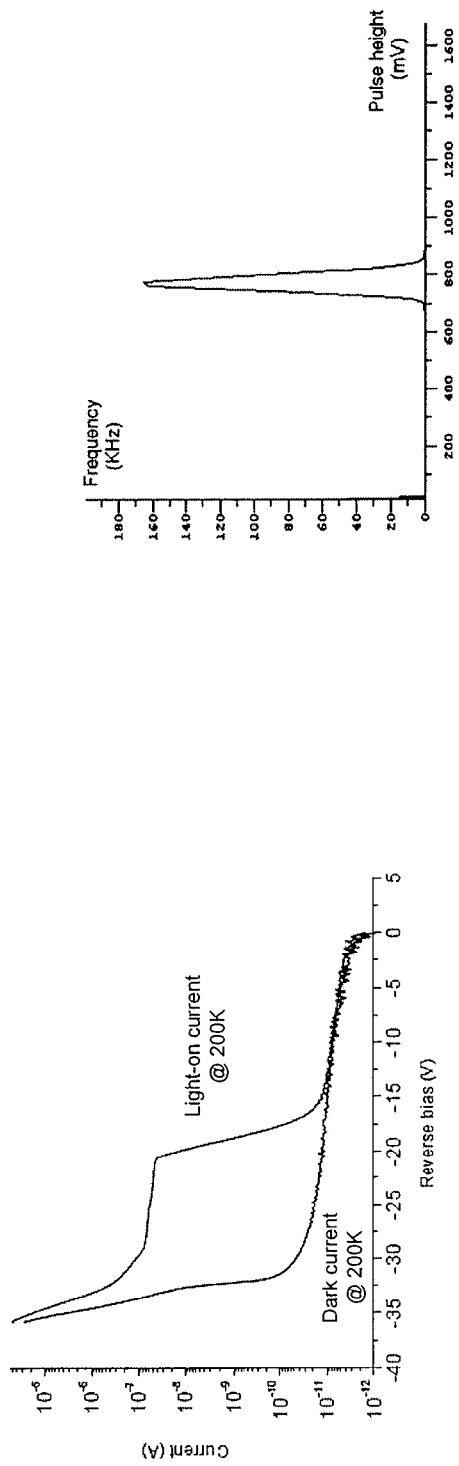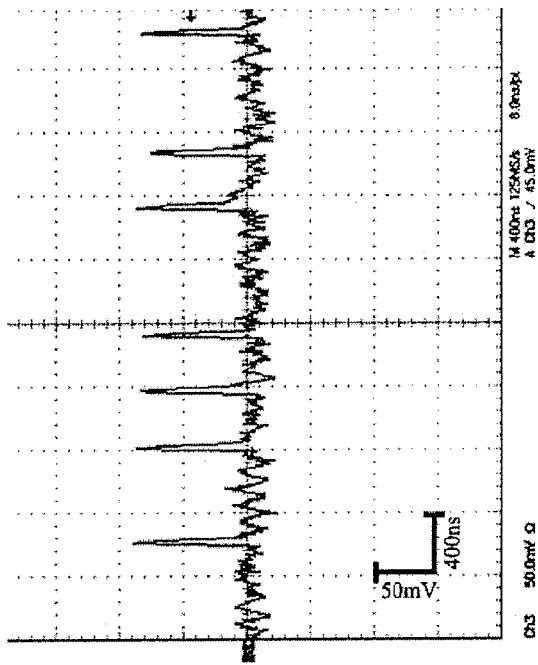
FIG. 17A
FIG. 17B
FIG. 16

| Layer | Thickness |
|---|---|
| InGaAsP | 0.05 μm |
| InP | 0.1 μm |
| InGaAsP | 0.5 μm |
| InAlAs | 0.3 μm |
| InGaAsP | 0.3 μm |
| InAlAs pin | 1.05 μm |
| InP | 0.05 μm |
| InGaAsP | 0.09 μm |
| InGaAs | 1.5 μm |
| InP | 0.2 μm |
| InGaAsP | 0.2 μm |
| InP substrate | |

FIG. 20

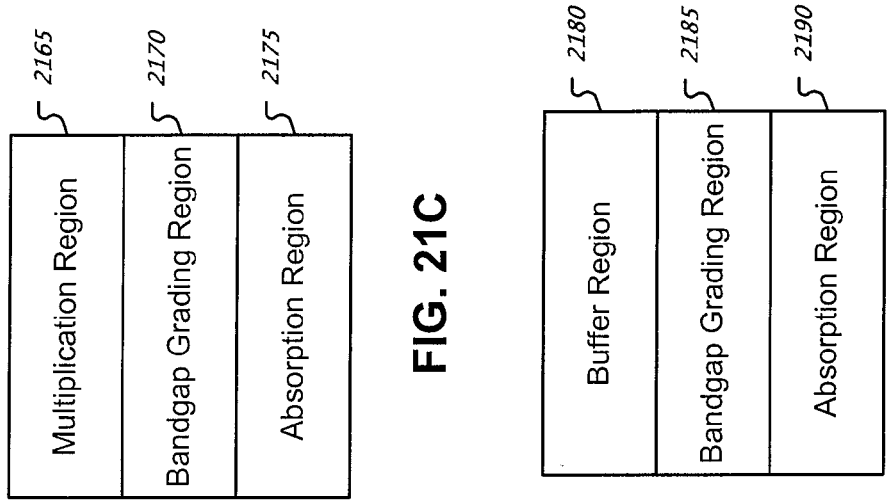
FIG. 21C
FIG. 21D
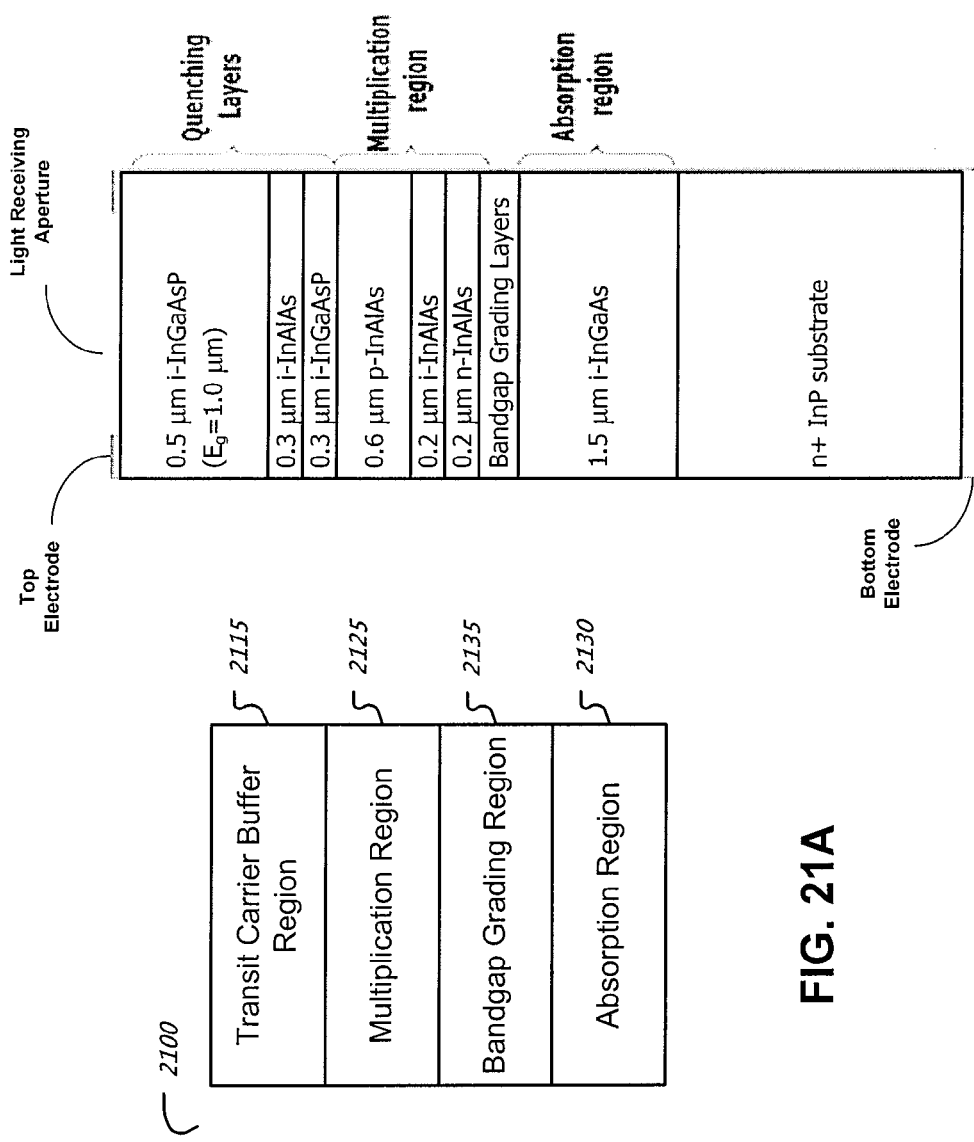
FIG. 21B
FIG. 21A

US 8,637,875 B2

SINGLE PHOTON IR DETECTORS AND THEIR INTEGRATION WITH SILICON DETECTORS

PRIORITY CLAIM

This document claims the benefit of U.S. Provisional Application No. 61/080,172 entitled "Integrated IR Detector" and filed on Jul. 11, 2008, which is incorporated by reference as part of the disclosure of this document.

FEDERALLY SPONSORED RESEARCH OR DEVELOPMENT

The invention was made with government support under Grant No. W911NF-05-1-0243 awarded by ARO. The government has certain rights in the invention.

BACKGROUND

This document relates to semiconductor devices including semiconductor photodetectors and photodetector arrays.

Semiconductor pn junctions can be used to construct photodiodes for detecting photons. An avalanche diode is one example of such photodiodes. Single-photon avalanche diodes (SPADs) are designed to detect single photons and can be used in a variety of applications, including biological, military and biometric applications. A SPAD can be operated in a Geiger mode to output a signal that represents a photon-arrival event or the time of arrival of a photon. As such, SPADs can be used as low-light-level imagers, sensors for Time-Correlated Single-Photon Counting and Fluorescence Correlation Spectroscopy and other sensing applications. When operated in the Geiger mode, a SPAD is in essence a reverse-biased pn junction which can sustain numerous avalanche breakdowns without incurring damage and with minimal charge trapping. When a photon is absorbed in the high-field region of the SPAD, the SPAD generates an electron-hole pair which can induce an avalanche through impact ionizations. This avalanche can be electrically sensed with high timing accuracy, and is quickly quenched. The pn junction is then reactivated by recharging the junction in excess of its breakdown voltage.

SUMMARY

This document describes technologies, among other things, for single photon detection.

In one aspect, apparatuses and systems for photon detection can include a first optical sensing structure structured to absorb light at a first optical wavelength; and a second optical sensing structure engaged with the first optical sensing structure to allow optical communication between the first and the second optical sensing structures. The second optical sensing structure can be structured to absorb light at a second optical wavelength longer than the first optical wavelength and to emit light at the first optical wavelength which is absorbed by the first optical sensing structure.

These and other implementations can include one or more of the following features. The first optical sensing structure can include a silicon substrate and is a silicon-based optical detector. The second optical sensing structure can include an IR optical detector which emits light at the first optical wavelength by converting energy in absorbed light at the second optical wavelength via luminescence resulting from hot carrier recombination. The first optical sensing structure can include a silicon detector. The second optical sensing structure can include a III-V semiconductor stack. The second optical sensing structure can include an InGaAs/InP stack.

In some implementations, apparatuses and systems can include a silicon dielectric layer as an interfacing layer formed between the first optical sensing structure and the second optical sensing structure. Apparatuses and systems can include a complementary metal-oxide-semiconductor (CMOS) circuit to control the first optical sensing structure and the second optical sensing structure.

In some implementations, the second optical sensing structure can include an absorption structure which absorbs light at the second optical wavelength and a multiplication material layer between the absorption structure and the first optical sensing structure to emit light at the first optical wavelength. The absorption structure can have a bandgap less than a bandgap of the multiplication structure. The absorption structure can have a bandgap similar to a bandgap of the multiplication structure.

In some implementations, the second optical sensing structure can include an absorption structure which absorbs light at the second optical wavelength and a multiplication structure between the absorption structure and the first optical sensing structure to emit light at the first optical wavelength. The absorption structure can have a bandgap less than a bandgap of the multiplication structure. The absorption structure can have a bandgap similar to a bandgap of the multiplication structure.

In some implementations, apparatuses and systems can include a dielectric layer interfacing between the first and the second optical sensing structures to permit transmission of light and to fuse the first and the second optical sensing structures together as a single structure. The first and the second optical sensing structures can be fused together as a single structure are free of an electrical contact structure between the first and the second optical sensing structures. The first optical sensing structure can include a $SiO_2$ shallow-trench-isolation (STI) guard ring structure.

The first optical sensing structure can include an array of detector pixels. The second optical sensing structure can include an array of detector pixels. Implementations can include one or more layers to minimize inter-pixel cross-talk between the first and second optical sensing structures.

The second optical sensing structure can include an absorption region structured to absorb photons at the second wavelength; a multiplication region structured to generate an avalanche of electrons in response to an absorbed photon to cause photons to be emitted at the first optical wavelength; and a buffer region coupled with the multiplication region, and structured to impede electrons or holes from the avalanche from passing through the buffer region to cause a reduction in an electric field across the multiplication region to quench the avalanche, and to allow electrons or holes to pass through the buffer region to cause an increase in the electric field across the multiplication region to facilitate a recovery from the avalanche. Implementations can include a bandgap grading region coupled with the multiplication region, at least a portion of the bandgap grading region having a spatially varying bandgap profile that monotonically changes between a first region that interfaces with the multiplication region and a second region.

In yet another aspect, apparatuses and systems can include a semiconductor absorption region structured to receive light at a first wavelength to generate one or more charged carriers by absorbing received light; a multiplication region structured to receive the one or more charged carriers generated from the semiconductor absorption region and to generate an avalanche of secondary charged carriers in response to the one or more charged carriers and emit secondary photons from the secondary charged carriers; a region coupled between the absorption region and the multiplication region, the region comprising a mechanism that quenches the avalanche of the multiplication region after occurrence of the avalanche and resets the multiplication region for a next avalanche; and a semiconductor transition region formed between the multiplication region and the absorption region to have a first bandgap at a first interface with the multiplication region that is equal to or similar to a bandgap of the multiplication region and a second bandgap at a second interface with the absorption region that is equal to or similar to a bandgap of the absorption region, the semiconductor transition region having a spatially varying bandgap between the first and second interfaces to eliminate an abrupt change in bandgap between the multiplication region and the absorption region.

In yet another aspect, apparatuses and systems can include a semiconductor absorption region structured to receive light at a first wavelength to generate one or more charged carriers by absorbing received light; a multiplication region structured to receive the one or more charged carriers generated from the semiconductor absorption region and to generate an avalanche of secondary charged carriers in response to the one or more charged carriers and emit secondary photons from the secondary charged carriers; a region coupled between the absorption region and the multiplication region, the region comprising a mechanism that quenches the avalanche of the multiplication region after occurrence of the avalanche and resets the multiplication region for a next avalanche; and a semiconductor transition region formed between the buffer region and the absorption region to have a first bandgap at a first interface with the buffer region that is equal to or similar to a bandgap of the buffer region and a second bandgap at a second interface with the absorption region that is equal to or similar to a bandgap of the absorption region, the semiconductor transition region having a spatially varying bandgap between the first and second interfaces to eliminate an abrupt change in bandgap between the buffer region and the absorption region.

In yet another aspect, apparatuses and systems can include a semiconductor absorption region structured to absorb photons at a first wavelength to generate one or more charged carriers; a multiplication region structured to receive the one or more charged carriers, the multiplication region structured to generate an avalanche of electrons in response to the one or more charged carriers and emit secondary photons at a second wavelength shorter than the first wavelength; a buffer region structured to impede electrons or holes from the avalanche from passing through the buffer region to cause a reduction in an electric field across the multiplication region to quench the avalanche; and a bandgap grading region adjacent to the absorption region, at least a portion of the bandgap grading region having a spatially varying bandgap profile that monotonically changes between a first region that interfaces with the absorption region and a second region.

These and other implementations can include one or more of the following features. In some implementations, the buffer region can be structured to allow electrons to pass through the buffer region to cause an increase in the electric field across the multiplication region to facilitate a recovery from the avalanche. In some implementations, the buffer region can be structured to allow holes to pass through the buffer region to cause an increase in the electric field across the multiplication region to facilitate a recovery from the avalanche. In some implementations, the bandgap grading region can be positioned between the absorption region and the multiplication region, wherein the second region of the bandgap grading region interfaces with the multiplication region. In some implementations, the bandgap grading region can be positioned between the absorption region and the buffer region, wherein the second region of the bandgap grading region interfaces with the buffer region. The buffer region and the multiplication region can be structured to create an energy barrier by a valence band offset. Implementations can include a mechanism to bias the second optical sensing structure at a DC voltage. The multiplication region can be optically coupled with an optical sensing structure. The buffer region can include an InAlAs layer. The buffer region can include an InAlAs, InGaAsP, and InAlAs stack. The bandgap grading region can include one or more InGaAsP graded index layers.

The details of one or more implementations are set forth in the accompanying drawings, and the description and the claims in this document.

BRIEF DESCRIPTION OF THE DRAWINGS

FIGS. 13A, 13B, 13C, 13D show different graphs associated with a self-quenching, self-recovery SPAD.

FIG. 16 shows example of an I-V response of a self-quenching and self-recovering device in the dark and in 1550 nm illumination.

FIG. 17A shows an example of an output pulse height at a bias voltage of 30.4 V.

FIG. 17B shows an example of output pulse signals triggered by a series of single photons.

FIG. 20 shows a cross-section example of a SPAD in a detector device.

FIGS. 21A and 21B show SPAD devices having a semiconductor transition region between the multiplication region and the secondary photo absorption region.

FIGS. 21C and 21D show different bandgap grading region layouts.

Like reference symbols in the various drawings indicate like elements.

DETAILED DESCRIPTION

Figure 1:
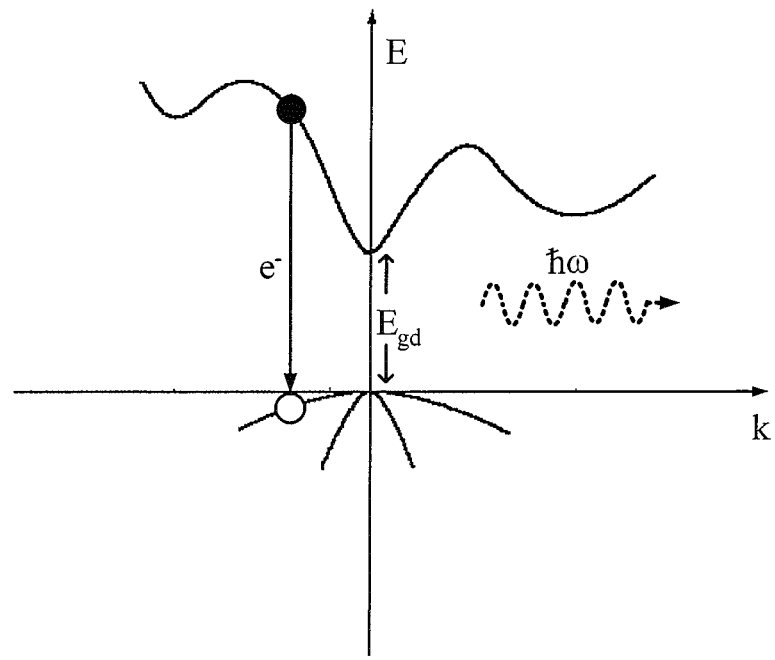
FIG. 1 shows an example of an InP energy band diagram that illustrates hot-carrier luminescence in a direct recombination processes.

This document describes, in one aspect, examples of single photon detection apparatuses and systems such as integrated infrared (IR) detectors and detector arrays based on a hybrid structure comprised of two avalanche detectors for detecting light at two different wavelengths that are coupled to each other in an integrated package. For example, an IR avalanche diode can be coupled to a silicon single-photon avalanche detector to form this hybrid structure. Such a device can be designed to produce electroluminescence resulting from hot-carrier recombination as a upconversion mechanism to convert received light into light of a shorter wavelength. The two detectors can be two SPADs.

In some implementations of the hybrid structure, an interconnection between an IR avalanche diode and the silicon avalanche diode is exclusively optically, and thus no electrical interconnection is required between the IR avalanche diode and the silicon avalanche diode. This optical interconnection makes the manufacturing of the devices simple and inexpensive because the two detectors formed on two different substrates can be coupled to each other by fusing their dielectric passivation layers without requiring lattice matching between the two devices. Advantageously, the hybrid structure can be made for various IR detecting materials at various IR wavelengths for the IR detector without limitations imposed by the lattice matching between the two devices. Because of lack of electrical interconnection, electrically conductive bumps for electrical interconnection are not needed and thus detector pixels in a detector array can be packed more closely together, making it possible to achieve small pixel pitch for high-resolution IR imaging.

The above hybrid structure of an IR detector and a Si detector is an example of a detection device or an array element that includes a primary detector such as an IR detector and a secondary detector that detects light emitted by the primary detector. The IR detector (the primary detector) may be formed of III-V materials (e.g., InGaAs/InP) and other suitable IR absorbing semiconductor materials. The IR detector may be structured to include a separate absorption layer and a multiplication layer in a separate absorption and multiplication (SAM) structure. The secondary detector, e.g., a silicon detector such as an shallow-trench-isolation (STI)-bounded Si detector or a suitable detector, can be based on a CMOS process, a BiCMOS process or other suitable silicon process.

In some implementations of the SAM structure, an emission can be increased by introducing an energy discontinuity at the edge of the multiplication region, e.g., away from the absorption layer. This discontinuity causes a local accumulation of the hot carriers, thereby increasing the probability of recombination and thus the electroluminescence yield that can be measured by the number of photons emitted per hot carrier. As an example, a semiconductor device based on the technical features in this document can include a substrate; a first optical sensing structure formed on the substrate to absorb light at a first optical wavelength; and a second optical sensing structure formed on a second substrate and fused over the first optical sensing structure. The second optical sensing structure can be structured to absorb light at a second optical wavelength longer than the first optical wavelength and to emit light at the first optical wavelength which is absorbed by the first optical sensing structure. The first and second optical wavelengths are different optical wavelength bands, e.g., a silicon detector can be used to detect light from 400 nm to 1100 nm. In one implementation of this device, the substrate is a silicon substrate, the first optical sensing structure is a silicon-based optical detector, and the second optical sensing structure is an IR optical detector which emits light at the first optical wavelength by converting energy in absorbed light at the second optical wavelength via luminescence resulting from hot carrier recombination. The second optical sensing structure can include an absorption structure which absorbs light at the second optical wavelength and a multiplication material layer between the absorption structure and the first optical sensing structure to emit light at the first optical wavelength. The absorption structure can have a bandgap less than a bandgap of the multiplication structure.

In implementations of detector devices based on the above hybrid structure, a detector device can include an IR avalanche detector and an Si detector that are fused through a silicon dioxide layer. The IR avalanche photodiode can be operated either in sub-Geiger or in Geiger mode as a single-photon detector. For example, the IR single photon avalanche photodiode (SPAD) can be constructed with a separate absorption and multiplication (SAM) zones. As a specific example, the absorption zone can be in InGaAs with a narrow bandgap, which can efficiently absorb photons, e.g., at 1550 nm which is used in communications and other applications, and the multiplication zone can be in InP, a direct bandgap material with a bandgap of 1.4 eV which is higher than that of silicon. A photogenerated electron-hole pair can induce an avalanche by a chain reaction of impact ionizations in the InP region. The accelerated (hot) electrons can impact stationary holes and the recombination of the hot electrons and the holes releases the excess energy with a known distribution that has a component above the energy bandgap of the material (InP). Therefore, this component manifests itself as a secondary radiation of electroluminescent photons and can be detected in silicon. The electroluminescent photons can be emitted isotropically. Some of such electroluminescent photons can reach the depletion region of the silicon SPAD, which is biased above its breakdown voltage. As a result, an avalanche breakdown occurs, and is detected by sensing circuitry, either on or off the same silicon die.

The IR and visible-wavelength SPADs in hybrid structures can be structured and operated in various configurations. For example, the IR SPAD can be configured to be back-illuminated so the emission occurs at the side facing the Si SPAD, or illumination can be through the back side of the silicon SPAD (which is transparent to IR wavelengths) and the primary photons in IR impinge directly on the front surface of the IR detector. The IR SPAD can have a multiplication region that includes a direct-bandgap material such as InP or GaAs, which has a higher photon-to-hot-electrons electroluminescence yield than indirect-bandgap materials. The IR SPAD can be configured to have its quenching mechanism contained within the device itself to maximize the performance gain from this scheme. The IR SPAD can have as shallow a junction as possible underneath the surface to minimize self-absorption of the secondary photons, and should have as thin a passivation layer as possible, to minimize dispersion of these photons away from the silicon SPAD. The silicon SPAD can be designed to have as wide an absorption region as possible, in order to increase the absorption probability of the electroluminescent photons. The two SPADs can be fused at the silicon dioxide layer or a suitable common passivation layer with minimal voids to reduce optical loss and enhance the mechanical integrity. The fusing can be performed either on wafer level or per die. The former can offer significant cost saving.

In addition, structures may be included in the two SPADs to enhance or maximize coupling between the two SPADs or to reduce inter-pixel cross-talk in an array of sensors. For example, such structures can include micro-lenses between the two SPAD detectors for collecting and focusing emitted light from the IR SPAD onto the silicon junction of the silicon SPAD; trenches between IR pixels to reduce optical crosstalk; metal rings around the silicon or IR pixels to prevent photons emitted from one pixel to reach adjacent pixels; and dielectric structures around the IR devices to reflect photons that are emitted away from the silicon device back towards the silicon device for efficient collection and detection of photons at the silicon device.

In some implementations, IR detectors tend to exhibit high dark counts which compromise the IR detection performance. Techniques are provided to significantly reduce or virtually eliminate the effect on the IR detection performance caused by the dark current counts. In cases where active illumination is used by, e.g., using a laser beam to illuminate a target under imaging, an electrical signal correlated to the laser pulse either biases the IR detector such that the IR detector is only active in a limited time window, or does the same to the silicon SPAD, or activates a read-out circuit such that signals are only read in a time window when signals are expected. Another scheme for eliminating the effect of dark counts can be used when the resolution of the image is less than the resolution of the IR array. In such a scenario, a "real" illumination will cause an avalanche in at least two adjacent IR pixels, which will be detected by a corresponding number of silicon pixels. A logic gate can locally process the SPAD outputs and only pass those pulses which are valid (dark counts are non-correlated so the probability of two adjacent cells firing simultaneously due to dark counts can be shown to be negligible for realistic sampling time-gates).

Such an integrated detector structure can be used to provide scalability for forming large arrays such as processing parallel communication channels simultaneously and array imaging (e.g., 3D imaging), as well as for high-sensitivity infrared imaging. The pitch of detection pixels in this case is not limited by present wafer-level interconnection schemes such as indium bumps or cross-vias because optical interconnection is used. Optical and/or physical isolation structures may be used, such as mesa structures, for limiting the avalanche propagation or metal barriers to provide optical isolation between adjacent pixels. In some implementations, an electrical readout can be eliminated for a primary detector to reduce the junction capacitance of an IR detector, because a secondary detector can process optical information coming from the primary detector. The described technologies can produce significant reductions in power consumption and other performance improvements such as improved speed and reduced afterpulsing.

Several techniques can be used to evaluate single-photon detectors. The single-photon detection probability, $\eta$, is the product of the probabilities of a photon being absorbed in the material and of it initiating a detectable avalanche. The detector's spectral response describes the wavelength-dependence of this detection probability. These metrics depend on the percentage of pixel area which collect photons (fill ratio); on the absorbing layer's composition, depth and thickness; and on the electric field distribution in the multiplication region.

During the recharge process following an avalanche, the SPAD can be temporarily biased below the breakdown voltage, and cannot generate an avalanche pulse in response to a photon. This time is called the device dead time and depends on the recharge mechanism, on the overbias above breakdown and, most significantly, on the junction's capacitance.

Dark counts result from avalanches which are not induced by absorbed photons. They can originate from thermally-generated carriers; from band-to-band tunneling; via trap-assisted tunneling; and by afterpulsing—the release of carriers trapped in prior avalanches. The latter mechanism is an important factor in determining the device dead time.

The time-delay spread between the photon absorption event and the clocking of the resulting electrical signal depends on the diameter of the SPAD as well as on the timing circuitry. The time-delay spread can determine the timing resolution of the single-photon detector.

Solid-state IR SPADs detectors can have separate absorption and multiplication regions, whereby, for example, photons are absorbed in a structure such as a thick (e.g., several microns) lightly-doped InGaAs layer. The photo-generated carriers are swept towards an InP high-field multiplication region where impact ionizations provide gain. When the extraction rate of carriers from this multiplication region falls below the creation rate, an avalanche breakdown is said to occur and the gain becomes "infinite". Some detectors can operate in a Geiger Mode (GM) for single-photon detection. The avalanche must be quenched to avoid damage to the junction.

In some implementations, quenching can be achieved passively, by using a voltage-limiting resistor in series with the device, or actively, using a circuit which senses the onset of the avalanche, and subsequently quenches it. Once the avalanche has been quenched, the diode capacitance can be recharged, either passively, through the quenching resistor, or actively, using a recharging circuit. In some implementations, a SPAD can be self-quenched.

IR Geiger-mode single photon avalanche diodes (GM-SPADs) can be amenable to integration in large arrays and to mass production because they can be manufactured using standard lithographically-defined processing techniques. However, the support circuitry, including the quenching, recharging and processing circuitry must be implemented externally, usually in silicon.

Further, GM-SPADs may experience excessive amounts of noise. Hole-electron pairs, thermally generated at the edge of the high field region through Shockley-Read-Hall generation and separated by the strong electric field, can cause a "false" avalanche. Trap-assisted tunneling depends on the defect density in addition to the doping and may be exacerbated at high electric fields by barrier lowering via the Poole-Frenkel effect. Direct band-to-band tunneling requires strong electric fields above $7\times10^5$ V/cm occurs in devices with a breakdown voltage lower than $4E_G/q$, where EG is the bandgap energy and q is the electron charge. Finally, afterpulsing which results from the release of deep traps trapped during previous SPAD cycles, increases with high defect densities and is linearly dependent on the total charge flowing during an avalanche. The rate of emission of deep traps follows an exponentially decaying distribution which depends on the activation energy of each deep trap mechanism.

Some of these noise sources can be reduced by cooling. Deep trap lifetimes can increase exponentially as temperature is decreased. Thermal generation and tunneling increase as the bandgap decreases. Thus, in some implementations, cooling an IR SPAD may be required. For example, some IR SPAD may be cooled to about 200° K. At these temperatures, afterpulsing becomes the dominant noise source with rates on the order of tens of kHz and it becomes the main bottleneck for device bandwidth. Time-gating can reduce the effect of afterpulsing but due to its exponential time distribution, the separation between gates (device dead time) must be made long enough compared with the afterpulse lifetime, in order to sufficiently reduce the probability of experiencing an afterpulse during an exposure time gate. Furthermore, time gating is possible when the arrival time of the photon is known to within the duration of the gate. At low temperatures, SPADs can be operated in free-running mode with minimal afterpulsing effects where a sufficiently long hold-off time is used following an avalanche, thereby severely limiting the detection rate.

For a given technology, afterpulsing can be reduced by limiting the charge flowing during an avalanche. This may be done by active quenching but is achieved more efficiently by reducing the junction capacitance. The capacitance in IR SPADs is dominated by the capacitances of the readout, recharge and quenching circuitry, because these operations are implemented off-chip, either on a board or on a silicon die. Connections can be made using technologies such as wire bonding or by using indium bumps. This can limit the pixel pitch and may result in capacitances on the order of pF, thus deteriorating the noise performance of the device due to afterpulsing.

This document includes a description of integrated detectors that include a new interconnection and readout scheme which does not require electrical interconnections between an IR SPAD and a CMOS readout circuitry, offers superior upconversion efficiencies with low power, and is scalable to large arrays. By bypassing the requirement of electrical bonding between the SPAD pixels and the readout circuitry, the capacitance seen by the junction is significantly reduced. This results in a reduction in afterpulsing, which is the dominant noise source at low temperatures, while simultaneously decreasing the detector device's dead time.

An integrated detector device can be based on wavelength upconversion using a byproduct of the avalanche process, e.g., hot-carrier luminescence from a multiplication layer of the device. This luminescence can have a significant component at higher energies than the bandgap of the absorbing material, and can therefore be extended to several IR detection materials. Readout of the luminescent photons can be achieved by a coupled detector such as a silicon single-photon avalanche diode.

A manufacturing process for an integrated detector device can include utilizing a mature wafer-level glass-to-glass fusing technology in order to connect different components of an integrated detector device (see, e.g., J. Wei, S. M. L. Nai, C. K. S. Wong, Z. Sun, and L. C. Lee, "Low temperature glass-to-glass wafer bonding," IEEE Transactions on Advanced Packaging, vol. 26, pp. 289-294, 2003). For example, a wafer-level glass-to-glass fusing technology can form a connection between a III-V SPAD which detects the primary IR photon, and a silicon CMOS SPAD, which detects the up-converted photons, and which processes the information on the same die.

Hot-carrier luminescence can result from a recombination of hot electrons with holes. In direct bandgap materials, a photon is emitted whose energy equals the difference between the hot electron's initial energy and the bandgap. In an indirect recombination process, both energy and momentum must be exchanged, and the probability of such events is considerably lower, depending on the availability of suitable phonons. This is manifested by the different electron temperatures in these processes. In GaAs, the direct recombination process is characterized by an electron temperature of 800K while the indirect process in the same material exhibits a temperature of 3000K. The higher temperature stems from a longer mean lifetime, consistent with a less probable recombination event.

FIG. 1 shows an example of an InP energy band diagram that illustrates hot-carrier luminescence in a direct recombination processes. A hot electron accelerated by the strong electric field recombines with a hole at the valence band. The excess energy is released in the form of a photon with energy $\hbar\omega>E_{gd}$. A low-energy, infrared, component due to transitions between the light and heavy hole bands is also observed.

For a direct bandgap material, such as GaAs or InP, the photon emission rate is given by:

$$R_d(\hbar\omega) \partial \hbar\omega(\hbar\omega - E_{gd})^{1/2} f(E)[1-f(E-\hbar\omega)] \qquad (1)$$

where $\hbar\omega$ is the emitted photons' energy, $E_{gd}$ is the direct bandgap; E is the electron energy above the bottom of the conduction band; f(E) and $[1-f(E-\hbar\omega)]$ are the hot electron and the hole distributions, respectively, both of which strongly depend on the hot-carrier temperature.

Figure 2:
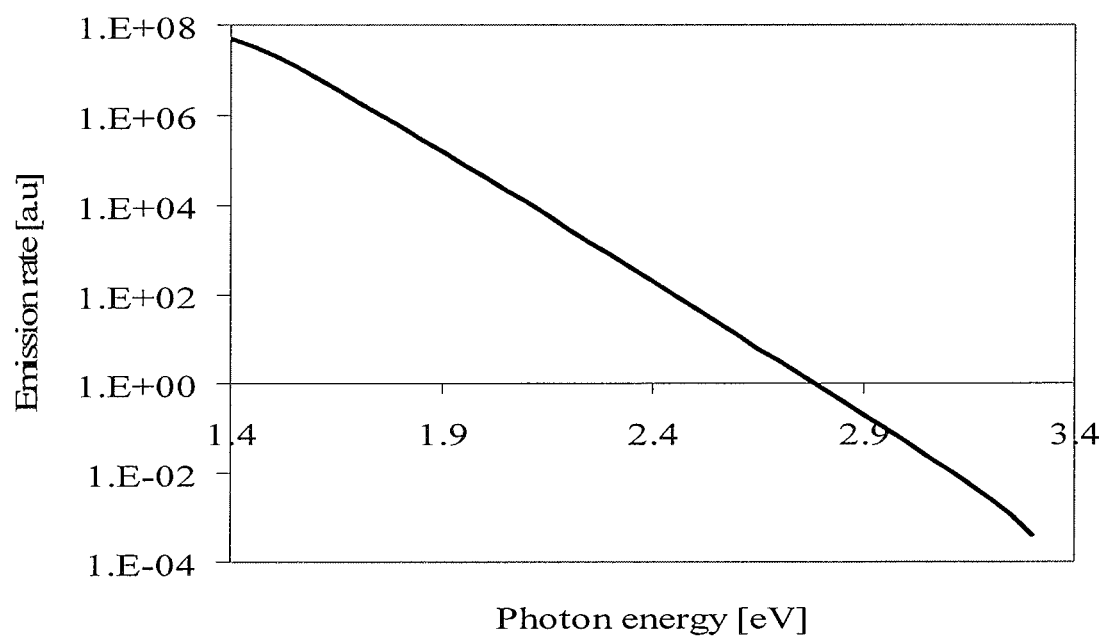
FIG. 2 shows an example of a calculated spectrum of electroluminescent photons emitted at the junction of an InP pn junction.

FIG. 2 shows an example of a calculated spectrum of electroluminescent photons emitted at the junction of an InP pn junction. The emission spectrum of InP was calculated using equation (1), and is shown in FIG. 2. Because the photons carry the excess energy after the recombination, $\hbar\omega>E_{gd}$ thereby achieving energy upconversion.

The efficiency of this upconversion depends on the electroluminescence yield, e.g., the photon emission rate per unit avalanche charge. This figure can be difficult to measure due to self-absorption by the emitting device, the detector's spectral response, the effect of defects, and collection uncertainties due to reflections. Kurtsiefer et al reported a figure of 39 photons per steradian in an avalanche with $4\times10^8$ electrons, resulting in a lower limit of $2.5\times10^{-6}$ photons per electron, where the detector's spectral response has been partly accounted for, and self-absorption was not (C. Kurtsiefer, P. Zarda, S. Mayer, and H. Weinfurter, "The breakdown flash of silicon avalanche photodiodes-back door for eavesdropper attacks?," Journal of Modern Optics, vol. 48, pp. 2039-2047, 2001). A measurement accounting for both the optical system and self-absorption was presented by Lacaita, with an emission efficiency of $2.9\times10^{-5}$ photons with energy higher than 1.14 eV per carrier crossing the junction (A. L. Lacaita, F. Zappa, S. Bigliardi, and M. Manfredi, "On the Bremsstrahlung origin of hot-carrier-induced photons in silicon devices," IEEE Trans. Electron Dev., vol. 40, pp. 577-582, 1993). Electroluminescence yield for InP has not been reported to date. It is expected to be significantly higher than that of silicon and is conservatively estimated to be $2.9 \times 10^{-4}$ photons per hot-carrier for the purposes of our calculation.

Figure 3:
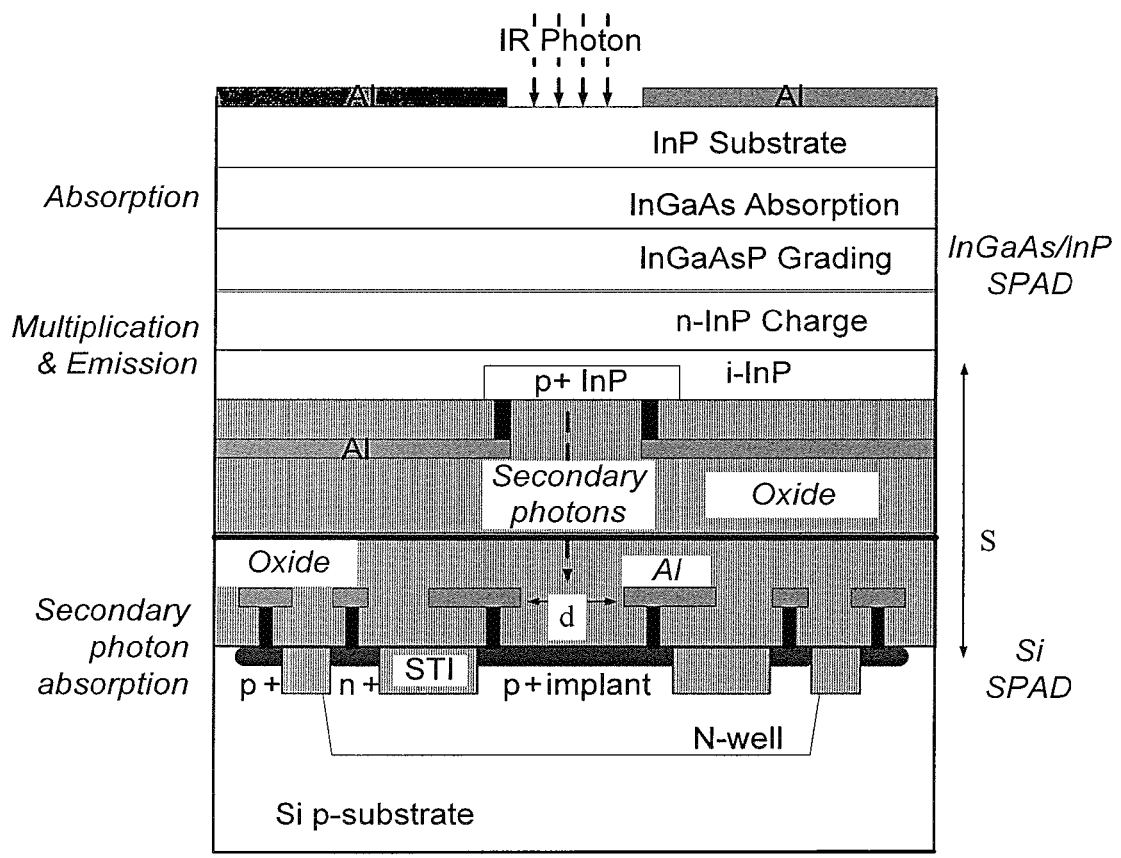
FIG. 3 shows a cross-section example of a device based on a hot-carrier luminescence effect.

FIG. 3 shows a cross-section examples of a device based on a hot-carrier luminescence effect. Such a device can include an InGaAs/InP SPAD fused with a silicon CMOS SPAD. In some implementations, the InGaAs/InP SPAD can include electrodes such as Al electrodes positioned on a layer of the InGaAs/InP SPAD. The InGaAs/InP SPAD can include an InP substrate, an InGaAs absorption layer, an InGaAsP grading, and a multiplication and emission region. The multiplication and emission region can include an n-InP charge layer, an i-InP layer, and a p+ InP layer. In some implementations, a primary IR photon is absorbed in a narrow-bandgap InGaAs layer, and the photogenerated charges are swept to a high-field multiplication region. During avalanche multiplication, secondary photons are emitted from the multiplication layers and are detected by the silicon SPAD, and processed on the same die. This upconverting hybrid pixel can be scaled to large arrays for parallel operation, for example in single-photon near infrared (NIR) imaging applications. A metal masking layer is used to minimize inter-pixel cross-talk. In some implementations, the silicon SPAD can include one or more Al regions positioned in an oxide. The silicon SPAD can include a shallow-trench-isolation (STI) guard ring structure. The silicon SPAD can include p+ regions, n+ regions, a p+ implant, and a N-well region positioned on a Si p-substrate.

In some implementations, an InGaAs SPAD is direct-bonded to a Si SPAD for optical readout. IR photons are incident on the back surface of the InGaAs SPAD. As carriers recombine during the avalanche, they release NIR and visible photons which are detected by the silicon device. The devices can be fused through their silicon-dioxide passivation layer, eliminating the need for lattice matching between the two semiconducting materials.

Determining the overall detection probability of the up-conversion scheme can include multiplying the primary NIR detection probability in the InGaAs/InP SPAD, by the emission probabilities (as a function of wavelength) of the electroluminescent photons emitted towards the silicon SPAD. One can account for self-absorption in the InP device. One can determine the probability of absorption of these photons in the silicon SPAD's depletion region, and can calculate the avalanche initiation probability of the photogenerated charge carriers. In some implementations, an up conversion probability can be expressed as:

$$\eta_{uc} = \int_{E_{gs}}^{E_{max}} \int_{x_{j2}}^{x_{j2}+x_d} \frac{\Omega}{4\pi} N_{sp}(\hbar\omega)[1 - P_{sa}(\hbar\omega, x_{j1})] \times \times \qquad (2)$$
$$P_{abs}(\hbar\omega, x_{abs}) P_{av}(x_{abs}) d(\hbar\omega) dx_{abs}$$

where $\Omega$ is the solid angle subtended by the silicon junction when seen from the InP junction; $N_{sp}$ is the number of electroluminescent photons at energies, $\hbar\omega$, emitted in a primary avalanche; $P_{sa}(\hbar\omega,x_{j1})$ is the probability of self-absorption of the secondary photons, which is a function of their energy and generation depth $x_{j1}$; $P_{abs}$ is the absorption probability in the silicon SPAD's depletion region, which extends from $x_{j2}$ to $x_{j2}+x_d$; and $P_{av}$, ($x_{abs}$) is the probability for an electron-hole pair photo-generated at $x_{abs}$ to induce a detectable avalanche.

Operations of an integrated IR detector device can cause a secondary photon emission towards a silicon junction in response to one or more photons hitting the primary detector of the device. An avalanche event in a SPAD can be viewed as a discharge of the junction capacitance, $C_j$, from an initial voltage, in excess of the diode's breakdown voltage to approximately the breakdown voltage. The total number of electrons flowing during an avalanche is:

$$N_e = \frac{1}{q}(C_j + C_p)V_{ob} \qquad (3)$$

where q is the electron charge (in Coulomb) $C_j$ is the junction capacitance, $C_p$ is any additional capacitance seen by the junction, including interconnection and sensing capacitances and $V_{ob}$ is the overbias above breakdown.

The number of secondary photons emitted from the primary junction can be expressed as:

$$N_{sp}(\hbar\omega) = \eta_e s(\hbar\omega) N_e \qquad (4)$$

where $\eta_e$ is the luminescence yield per electron (in relevant energies for Si absorption) and $s(\hbar\omega)$ is the normalized spectral distribution of the secondary photons. In some implementations, additional photons can be expected to be emitted from the charge region between the absorption and multiplication regions, where the high electric field is lower than the breakdown field, and thus recombination events are highly likely. It can be assumed that secondary photons are emitted from the maximum field region, at the junction plane.

Figure 4:
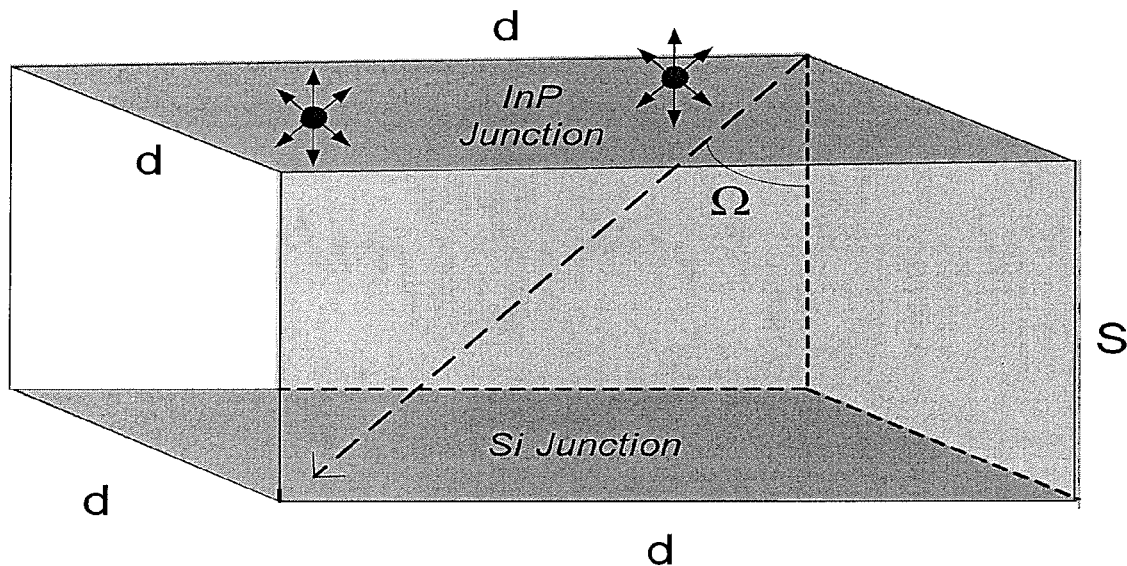
FIG. 4 shows an example of a geometrical construction for calculating the percentage of photons emitted from an InP junction plane onto a Si junction plane.

FIG. 4 shows an example of a geometrical construction for calculating the percentage of photons emitted from an InP junction plane onto a Si junction plane. A conservative approximation places all avalanching charges at one of the vertices of the emitting plane. It can be assumed that there is an isotropic emission from the junction plane. Consequently, only a fraction of the emitted photons, $$\frac{\Omega}{4\pi},$$

is transmitted towards the silicon junction. The solid angle, $\Omega$, for the case of a planar InP junction emitting towards a parallel planar silicon junction can be approximated by assuming all photons are emitted from one of the vertices of the InP rectangular junction, e.g., FIG. 4. This can provide a lower bound on the actual flux emitted towards the silicon SPAD. The solid angle subtended by the detector from this vertex can be approximated by:

$$\Omega = \tan^{-1}\frac{d}{S\sqrt{2d^2 + S^2}} \qquad (5)$$

where d is the side dimension of the Si junction and S is the vertical distance between the junctions. Equations (3), (4), and (5) can be combined to give:

$$\frac{\Omega}{4\pi}N_{sp}(\lambda) = \frac{1}{4\pi q}\tan^{-1}\frac{d^2}{S\sqrt{2d^2+S^2}}\eta_e S(\lambda)(C_j + C_p)V_{ob} \qquad (6)$$

Self-absorption in InP reduces the number of photons which reach the surface. It can be assumed that luminescence occurs at the junction plane, a distance $x_{j1}$ from the surface. The emitted photon population can be expressed as:

$$N_{surf}(\hbar\omega) = \frac{\Omega}{4\pi} N_{sp}(\hbar\omega)[1 - P_{sa}(\hbar\omega, x_{j1})] = \qquad (7)$$

$$= \frac{\left[\tan^{-1}\frac{d^2}{\sqrt{2d^2 + S^2}}\eta_e s(\hbar\omega)(C_j + C_p)V_{ob}\right]\exp\left(\frac{-\alpha_{InP}(\hbar\omega)}{x_{j1}}\right)}{4\pi q}$$

where $\alpha_{InP}(\hbar\omega)$ is an absorption coefficient in InP.

Based on a calculated spectral distribution of the emitted photons, one can estimate the probability for these photons to be absorbed by the Si SPAD, and can estimate the probability of generating an avalanche. It can be assumed that reflections at the interfaces do not substantially affect the number and spectral distribution of secondary photons.

In an STI-bounded shallow junction, the high field region can be highly localized in the depletion region of the junction, so it can be assumed that absorption occurs within the depletion region. The probability for N photons of energy $\hbar\omega$ to generate an electron-hole pair within this layer is:

$$P_{abs}^N(\hbar\omega) = 1 - \{1 - P_{abs}(\exp[-\alpha_{Si}(\hbar\omega)\cdot w_d] - \exp[-\alpha_{Si}(\hbar\omega)\cdot(x_{j2}+w_d)])\}^N \qquad (8)$$

with $\alpha_{Si}$ being the absorption coefficient in silicon, $w_d$ the depletion width and $x_{j2}$ the junction depth in the silicon device. The depletion width of the junction can be determined from the analytical expression for a one-sided linearly-graded junction:

$$w_d = \left(\frac{3V_B\varepsilon_s}{2qa}\right)^{1/3} \qquad (9)$$

where $V_B$ is the sum of applied and built-in voltages, $\varepsilon_s$ is the dielectric constant of silicon, q the electron charge and a the grading coefficient of the linearly-graded junction. The total upconverted photons' absorption probability in silicon can be calculated using equations (7), (8), and (9) over relevant wavelengths.

The probability that an absorbed photon induces an avalanche can be calculated. For a one-sided, linearly-graded pn junction, Poisson's equation translates to a field distribution:

$$E(z) = \frac{qa}{2\varepsilon_s}(w_d^2 - z^2) \qquad (10)$$

The avalanche probability can be estimated as a function of the position of generation of the electron-hole pair by solving the following coupled differential equations:

$$\frac{dP_{be}}{dz} = (1 - P_{be})\alpha P_{bp} \qquad (11a)$$

$$\frac{dP_{bh}}{dz} = (1 - P_{bh})\beta P_{bp} \qquad (11b)$$

where $P_{be}$ and $P_{bh}$ are the avalanche initiation probability by an electron and a hole, respectively, $\alpha$ and $\beta$ are the ionization rates of electrons and holes, respectively, and $P_{bp}$ is the joint avalanche initiation probability:

$$P_{bp} = 1 - (1 - P_{be})(1 - P_{bh}) = P_{be} + P_{bh} - P_{be}P_{bh} \qquad (12)$$

These equations can be solved numerically to provide an avalanching probability.

Figure 5:
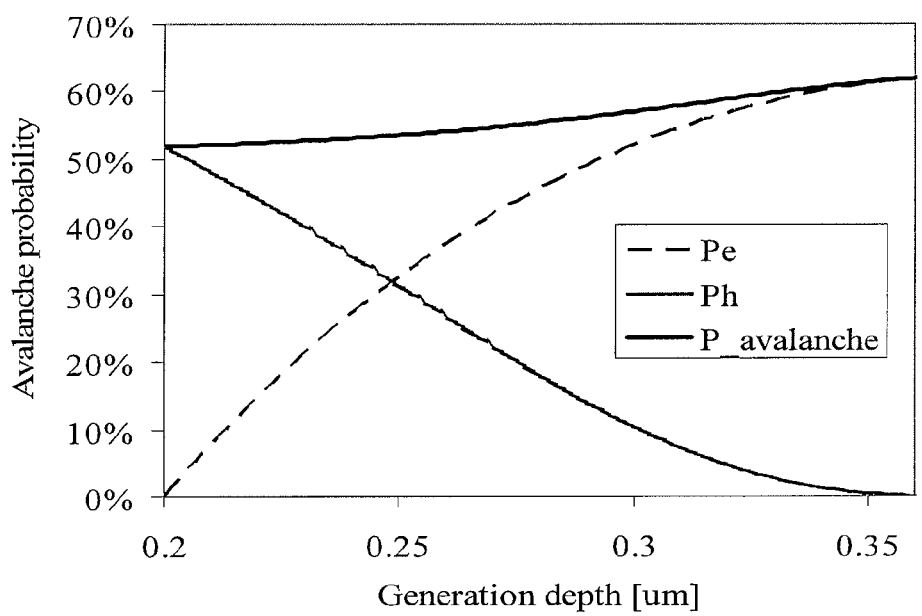
FIG. 5 shows a graph based on a numerical analysis example of electron, hole, and total avalanche initiation probabilities as a function of photon absorption depth in a Si SPAD.

FIG. 5 shows a graph based on a numerical analysis example of electron, hole, and total avalanche initiation probabilities ($P_e$, $P_h$ and $P_p$) as a function of photon absorption depth in a Si SPAD, based on equations (11a,b)-(12).

In some implementations, a detector device can include a self-quenched InGaAs/InP SPAD with an active area of 15 μm per side and can have a junction capacitance of 150 fF, dominated by the capacitance of the depleted region. Due to the optical readout, off-chip routing and the sensing circuit's capacitance, which can be on the order of a picofarad in SPADs with electrical readout, are eliminated. In some implementations, the passivation thickness of a 6-metal layer silicon device is on the order of 7 μm, so InP-SPAD/Si-SPAD capacitance can be negligible. In some implementations, a self-quenched InGaAs/InP SPAD can operate at an overbias of 5V with a junction located 200 nm below the surface.

Figure 6:
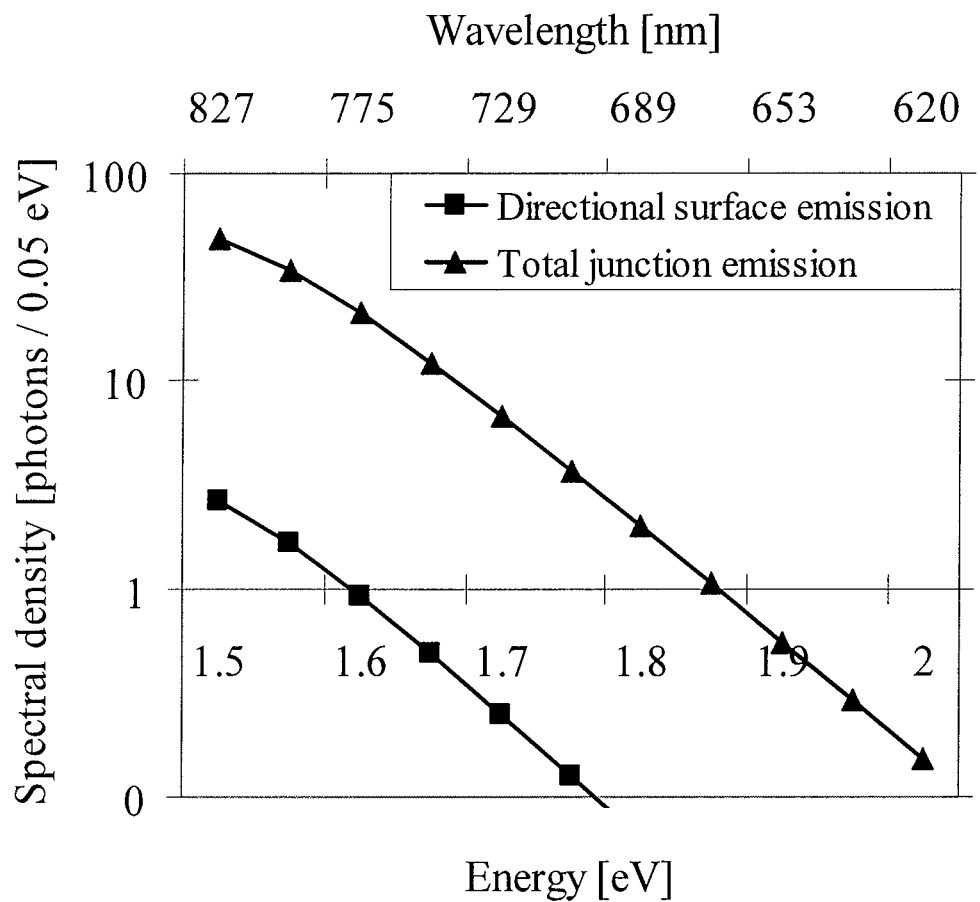
FIG. 6 shows an example of junction and surface electroluminescence spectral densities for a 200 nm deep InP junction.

FIG. 6 shows an example of junction and surface electroluminescence spectral densities for a 200 nm deep InP junction as described herein. The latter accounts for only those photons emitted towards the silicon junction. An estimate that 4.7×10⁶ electrons flow during an avalanche can be attained from equation (3). An estimate that 131 photons are emitted isotropically in the silicon absorption band from the junction can be attained from equation (4). The spectral density of these photons is shown in FIG. 6, both at the junction and, using equation (7), at the surface of the InGaAs/InP SPAD.

Figure 7:
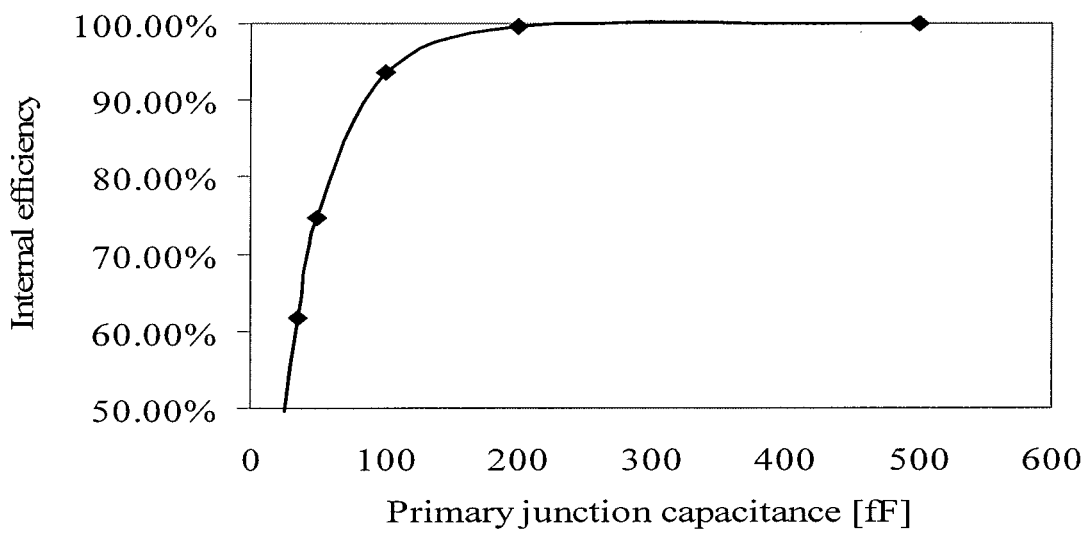
FIG. 7 shows an example of a numerical simulation of an internal upconversion efficiency as a function of primary SPAD's junction capacitance.

FIG. 7 shows an example of a numerical simulation of an internal up conversion efficiency as a function of primary SPAD's junction capacitance. The up conversion efficiency can be determined using the emitted spectral density and the sensitivity of the silicon detector. In some implementations, the total charge flowing in an InGaAs/InP SPAD can be increased.

A detector device, such as a device with primary and secondary detectors, can include a mechanism to prevent a positive feedback loop between the detectors. A silicon SPAD, positioned as a secondary detector, can emit electroluminescent photons which can be absorbed by an IR SPAD, positioned as a primary detector. Controlling the dead time of the IR SPAD to overlap the avalanche time of a silicon SPAD can prevent a positive feedback loop between the coupled SPADs.

In some implementations, the power dissipated during an up conversion process is the sum of the powers dissipated during the InP and silicon avalanche. These can be estimated as the product of the junction capacitances by their overbias, resulting in approximately 1 pW per detected photon.

Various examples of photon based systems that include one or more detectors can include systems for quantum key distribution (QKD), quantum communications, pulse position modulation communication links, fluorescence lifetime imaging microscopy (FLIM), and time-correlated single-photon counting (TCSPC), eye-safe laser detection and ranging (LIDAR), optical time-domain reflectometry (OTDR) and semiconductor failure analysis systems. In some implementations, single-photon detectors can operate at high frequencies such as tens to hundreds of MHz, can consume minimal power (<1 nW/bit), and can operate reliably at non-cryogenic temperatures over many cycles and can be manufactured at a low cost. When operated in arrays, such detector devices can have a small pitch and low pixel-to-pixel crosstalk. Further, such systems can feature low detector jitter for more efficient operations. For example, lower detector jitter can result in lower bit-error-rates in quantum key distribution systems, faster bit-rates in pulse position modulation optical links, and better temporal resolution in biological applications.

A silicon SPAD, such as a CMOS SPAD, can include a diffused guard-ring structure which can lead to increased jitter due to the lateral drift and diffusion of electron-hole pairs created by photon absorption in the low-field and neutral regions. The resulting diffusion tail can limit SPAD timing performance, e.g., in QKD systems and in classical pulse position modulation optical links, where diffusion tails limit bit error rates and bit rates, respectively, and in high-resolution FLIM, where better timing resolution translates into better image contrast. Therefore, in some implementations, a silicon SPAD can feature a SPAD architecture optimized not only for a minimal FWHM but also for a minimal full-width at hundredth-maximum (FW($1/100$)M).

Figure 8A:
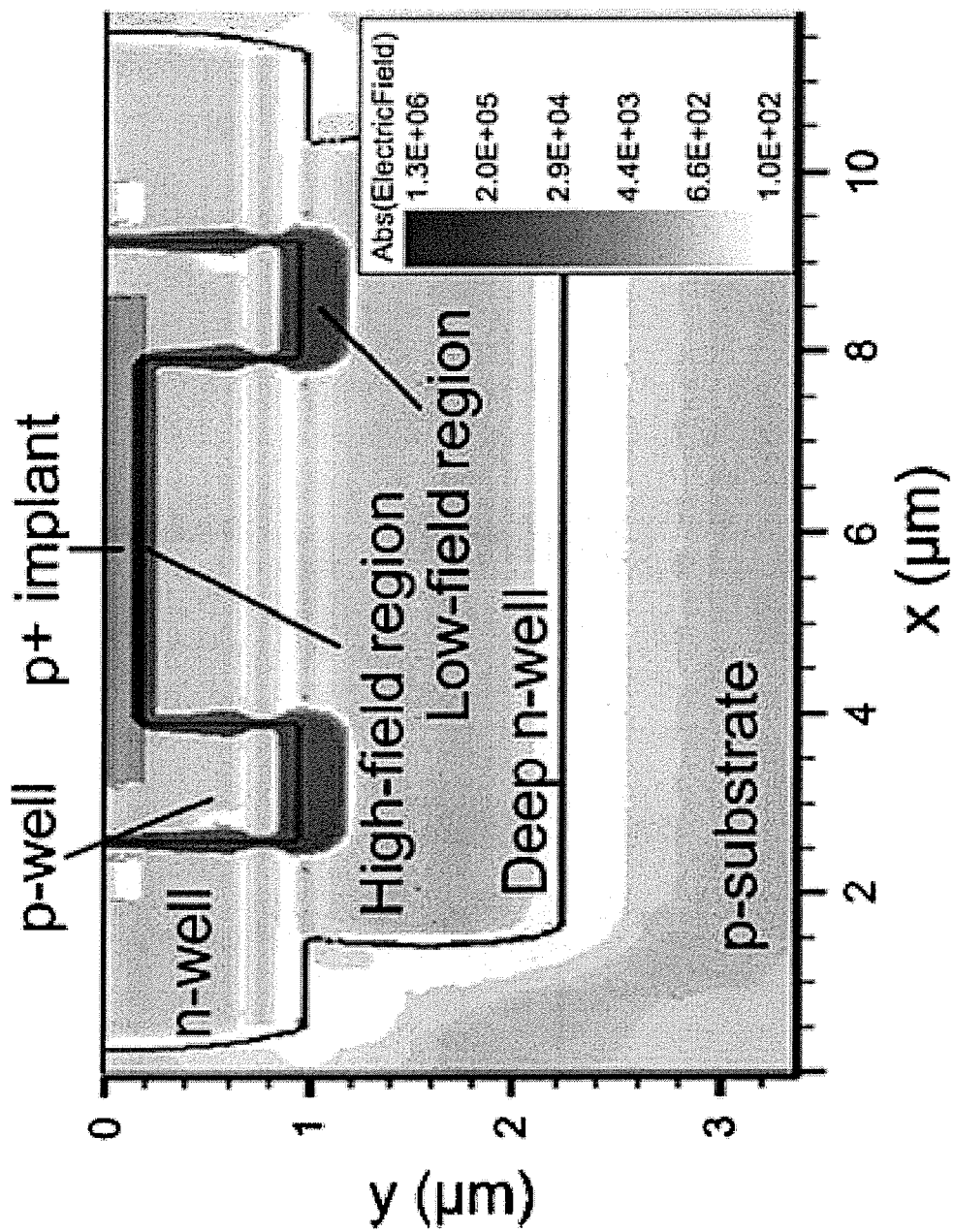
FIG. 8A shows an example of electric field distributions associated with a structure that includes a diffused guard ring structure.

FIG. 8A shows an example of electric field distributions associated with a structure that includes a diffused guard ring structure. In FIG. 8A, the electric field is given in volts per centimeter and coordinate micrometers. Some detectors can use a diffused guard ring structure. For example, a detector can include a triple-well diffused guard ring structure that has different electric field regions such as a high-field region, a low-field (diffused) region, and a neutral region where there is little or no electric field. Charges photogenerated inside the high-field region can induce an avalanche pulse almost instantaneously through a chain reaction of impact ionizations. Carriers generated in the low-field region can drift laterally toward the high-field region and subsequently initiate impact ionizations. In addition, carriers generated in the neutral region can diffuse toward the high- or low-field region and subsequently initiate an avalanche. The delay from the photogeneration event to the initiation of the avalanche that can increases the uncertainty in the photon arrival time. Such a diffused guard ring structure can result in a low-field region and, consequently, in increased timing uncertainties A silicon SPAD, such as a CMOS SPAD, that has a low detector jitter suitable for implementations of a detection device that integrates a silicon SPAD and an IR SPAD can include a shallow-trench-isolation (STI) guard ring structure to reduce jitter and to reduce or eliminate a diffusion tail. An area-efficient shallow-trench-isolation guard ring structure can prevent lateral drift and diffusion of charge carriers to enhance the detector's timing resolution. Certain technical information for silicon STI-SPADS is included in PCT Application No. PCT/US2007/074057 entitled "Shallow-Trench-Isolation (STI)-Bounded Single-Photon Avalanche Photodetectors" and published as PCT publication No. WO 2008011617, which is incorporated by reference in its entirety as part of the disclosure of this document. The trench isolation guard ring is capable of withstanding high electric fields and encloses a boundary of a p-n junction region to spatially confine diffusion of charges at the p-n junction to planarize the interface of the p-n junction of the diode. As a result, the guard ring can be used to prevent premature breakdown and to enhance uniformity of the electric filed distribution along the pn junction and thus the detection probability across the detection area or active area of the p-n junction. A guard ring can be formed to enclose the boundary of either or both of the shallow and deep pn junctions. Implementations of such guard rings can be used to achieve high fill factors and small pixels in compact and high performance sensor arrays.

Figure 8B:
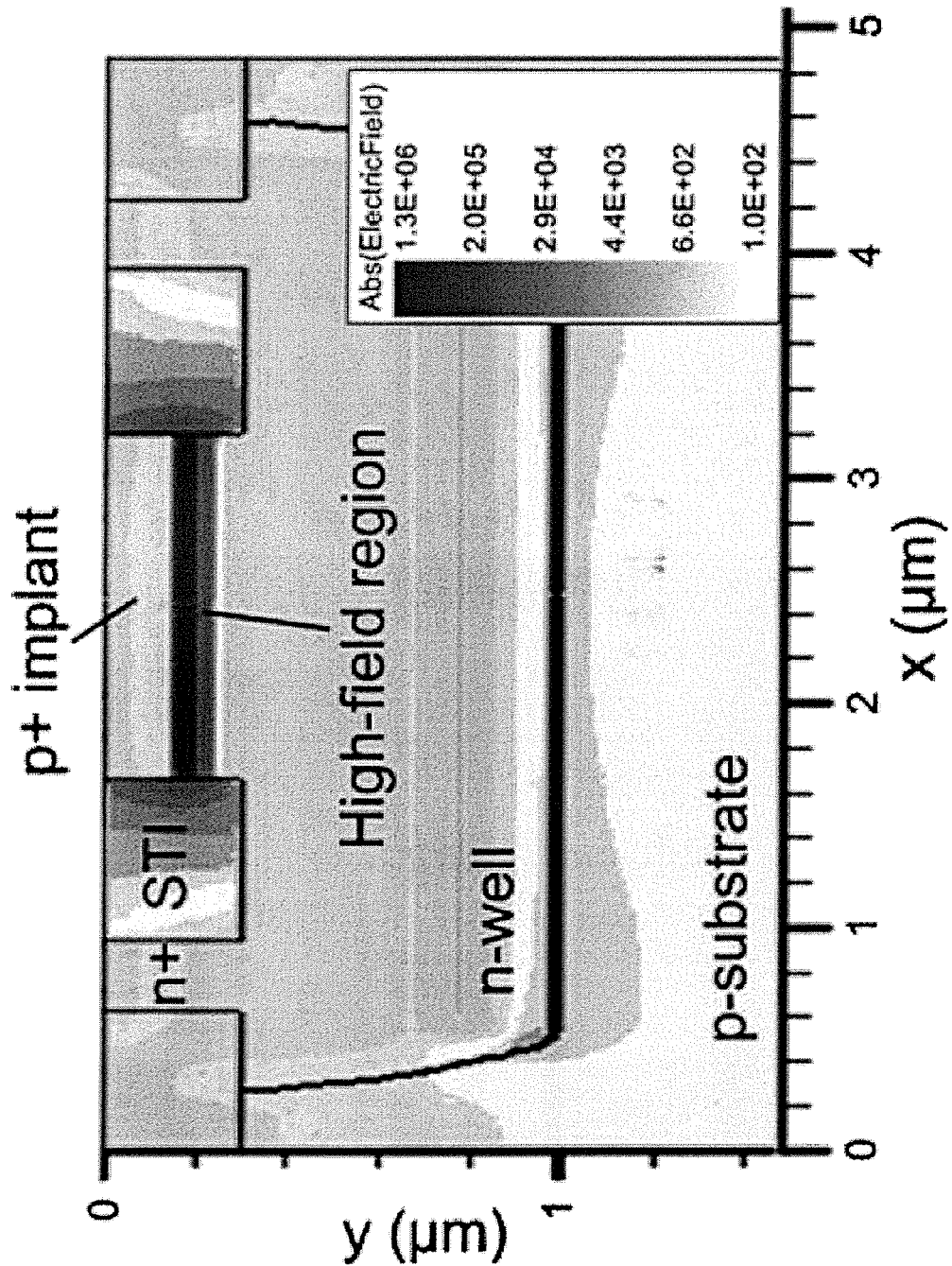
FIG. 8B shows an example of electric field distributions associated with a structure that includes a STI guard-ring structure.

FIG. 8B shows an example of electric field distributions associated with a structure that includes a STI guard-ring structure. In FIG. 8B, the electric field is given in volts per centimeter and coordinate micrometers. In a detector device that includes an STI structure, a region in the device that spatially corresponds to the lightly diffused region as shown in FIG. 8A can be replaced by $SiO_2$ to eliminate lateral drift and to increase timing resolution. In some implementations, the timing resolution of a STI-based CMOS SPAD can be 27-ps or less at full-width at half-maximum, and the diffusion tail can exhibit 96-ps full-width at hundredth-maximum.

A STI-based CMOS SPAD fabrication process can include a deep-submicrometer CMOS process such as one based on 0.18-μm CMOS technology. A STI's isolation trench can be constructed early in the fabrication process. In some cases, an isolation trench can prevent punch-through and latch-up in CMOS circuits. The edges of the subsequent drain implant are confined by an oxide trench that prevents lateral diffusion and formation of curved edges. In some implementations, such a manufacturing process can include using an IBM 0.18-μm CMOS technology through the MOSIS service, packaged in a high-speed quad flat no-lead (QFN) glass-top package with ultrashort wiring to minimize capacitance and inductance.

In some implementations, two different output buffers can be used, e.g., a source follower and an inverter chain. A source-follower buffer can use a circuit that outputs a voltage proportional to the current flow to allow a direct observation of an avalanche pulse. An inverter chain output buffer can generate uniform-amplitude pulses for improved compatibility with pulse counting electronics.

Figure 9B:
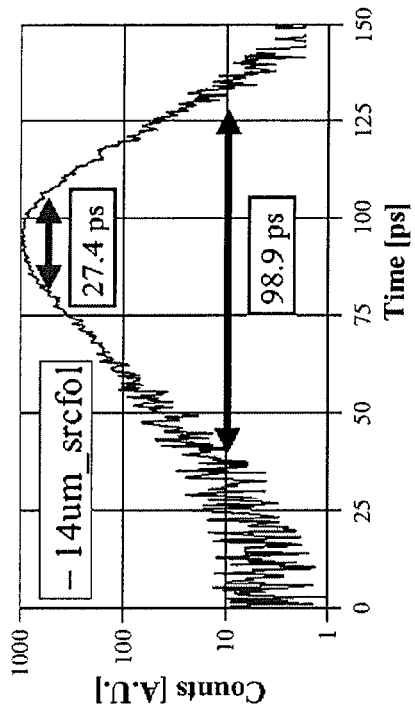
FIGS. 9A, 9B, and 9C show instrument response function examples for different STI-bound SPAD devices.
Figure 9A:
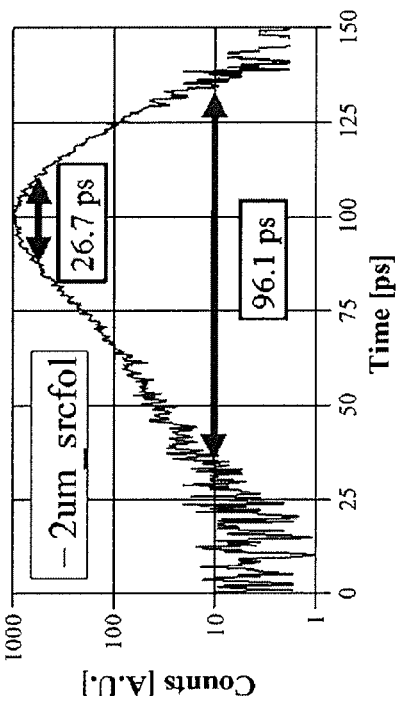

FIG. 9A, 9B show instrument response function (IRF) examples for different STI-bound SPAD devices with a source-follower output buffer biased 7% above its breakdown voltage. FIG. 9A shows an IRF of STI-bound SPAD device with an active area of 2 μm×2 μm. FIG. 9B shows an IRF of STI-bound SPAD device with an active area of 14 μm×14 μm. These active areas are characterized to determine the mechanism with the greatest impact on the device jitter such as longitudinal diffusion or lateral drift. Both devices were biased 7% beyond their breakdown voltage of 11 V. The jitter of STI guard-ring SPAD with an 2 μm×2 μm can have a 26.7 ps jitter at FWHM and a 96.1 ps jitter at FW($1/100$)M. The jitter of STI guard-ring SPAD with an 14 μm×14 μm. can have a 27.4 ps jitter at FWHM and a 98.9 ps jitter at FW($1/100$)M. Other dimensions for an active area are possible. The similar pulse arrival time histograms of the 2- and 14-μm devices demonstrate that lateral avalanche spreading is not the dominant jitter mechanism in these devices. The symmetric time-of-arrival histogram is typical of avalanches seeded in the high-field region; the lack of a long diffusion tail indicates that lateral drift is virtually eliminated. Longitudinal diffusion is also shown to be minimal.

Figure 9C:
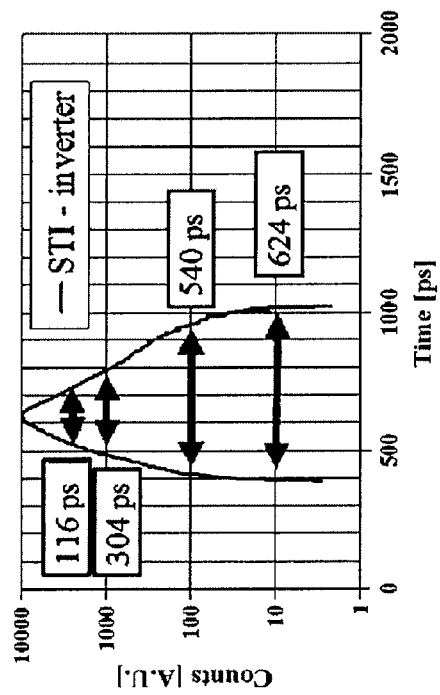

FIG. 9C shows an IRF of STI-bound SPAD device with an active area of 7 μm×7 μm with inverter output buffer biased at 7% beyond its breakdown voltage. The STI-bound SPAD IRF exhibits a factor-of-two improvement in the FW($1/1000$)M, from 1256 to 624 ps, when compared to a diffused guard-ring SPAD with a match active area dimension. The longer IRF in FIG. 9C when compared to those in FIGS. 9A and 9B with source-follower output buffers are due to a suboptimal avalanche pulse sensing threshold. The sensing threshold can be positioned low at the onset of the avalanche pulse. The source-follower output stage follows the diode's N-well terminal voltage, making it possible to search for an optimal sensing threshold. The inverter stage can have a fixed threshold defined by the relative sizes of its transistors. Consequently, its sensing threshold could not be tuned in the current test chip, and the respective IRF was longer.

In addition to the low jitter of the STI-bound SPAD device, such as device can exhibit shorter dead times and higher fill factor than diffused guard-ring SPADs. This can come at the expense of relatively high dark count rates (e.g., 104-106 counts/s) and afterpulsing, possibly due to interface states at the $SiO_2$—silicon boundary. Device implementations can include time gating and active recharging to reduce the effects of this noise to acceptable levels. In some implementations, a STI-bound SPAD can be scaled to megapixel arrays to enable improved performance in optical communication channels and better temporal resolution in biological applications.

A detector device can include an array of detector pixels. In some implementations, an array of III-V detector pixels can be constructed such that an avalanche region is spatially confined and an array of Si SPADs is aligned (e.g., using infrared imaging since it is transparent to Si) to the III-V detector pixels such that the active areas of the Si SPAD is aligned to the avalanche regions of the III-V semiconductor region. In some implementations, a detector device can include a metal layer on the III-V semiconductor region to minimize inter-pixel cross-talk. In some implementations, a detector device can include a metal layer on the Si semiconductor region semiconductor region to minimize inter-pixel cross-talk. A detection system can include an array of detector pixels configured for low-light level infrared imaging.

A detector device can be configured for front side illumination or back side illumination. In a front side illumination example, IR photons impinge on the back surface (bulk side) of the silicon wafer, pass through it and the $SiO_2$ dielectric (since Si is transparent to IR photons) and is absorbed by the III-V junction. In a back side illumination scheme, the III-V junction can be formed on top of an IR-transparent substrate. IR photons impinge on the back side of the III-V detector.

Some photon detector devices can include a mechanism for self-quenching and self-recovery within an InGaAs SPAD. At a critical field, the high probability of impact ionization through a semiconductor can generate a large avalanche current. The multiplication gain resulting from a single carrier undergoing this process can be in the millions, so a single photogenerated carrier can be detected. Left alone, this large avalanche current can continue and, due to presence of the large avalanche current caused by the first photon, the photodetector cannot detect a second photon. Some InGaAs SPADs cannot self-quench or cannot self-recover because they use an external circuit for quenching and recovery. However, such external circuitry can increase manufacturing costs and have performance issues. This document includes details of SPADs, such as an InGaAs SPAD, with a self-quenching and self-recovery mechanism without using the external quenching and recovery circuitry. For example, a SPAD can include a semiconductor layer in a detector stack that functions as a negative feedback mechanism for self-quenching and self-recovery.

A self-quenching, self-recovering SPAD can be configured to produce secondary photon emission. In some implementations, a self quenching avalanche photodiode can be made via bandgap engineering by using III-V materials latticed matched to InP. A buffer region such as a Transit Carrier Buffer (TCB) can be positioned next to a multiplication region to generate an energy barrier. Then the resulting electrons from the avalanche will be momentarily stopped by the barrier, e.g., TCB. This barrier can reduce the field across the multiplication region and thus stops the avalanche process. When the avalanche process triggered by an incident photon is stopped, the device is self quenched. As the electrons escape from the barrier, the field across the multiplication region recovers. At this time, the self-quenched detector is capable of detecting a second photon via another avalanche process.

The high energies of carriers undergoing avalanche breakdown can result in photoemission with energies larger than the bandgap of the material. By utilizing this property, a separate absorption and multiplication APD can detect low energy photons with a small bandgap absorption region, and generate photons in the multiplication region with higher energies. For example, an InGaAs—InP system can detect 1550 nm infrared, and output light such as visible light. In some implementations, the multiplication region is placed near the surface of the device to minimize self-absorption.

Figure 10A:
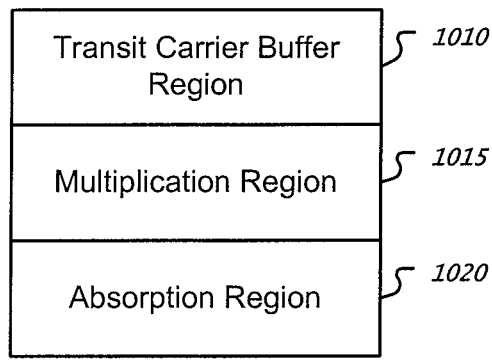
FIG. 10A shows an example of a device that includes a SPAD layout for self-quenching and self-recovery.

FIG. 10A shows an example of a device that includes a SPAD layout for self-quenching and self-recovery. A SPAD layout can include a a TCB region 1010, and a multiplication region 1015, and an absorption region 1020. Different SPAD layouts can include different layouts for a TCB region 1010, and a multiplication region 1015, and an absorption region 1020. In some implementations, a buffer region can be positioned before or after a multiplication region. In some SPAD layouts, a buffer region can be structured to impede electrons or holes from an avalanche process from passing through the buffer region to cause a temporary reduction in an electric field across a multiplication region to quench the avalanche.

Figure 10B:
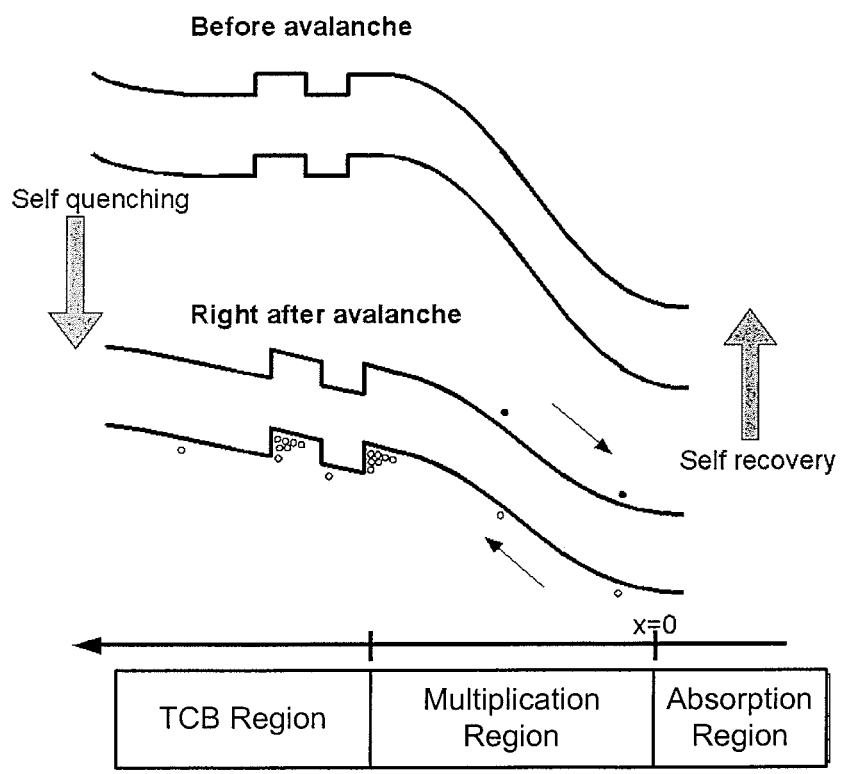
FIG. 10B shows example of a band diagram during self quenching and self recovery.

FIG. 10B shows an example of a band diagram during self quenching and self recovery where the bottom shows the corresponding semiconductor regions for the band diagram. This example shows a valence band offset to stop holes.

Figure 11A:
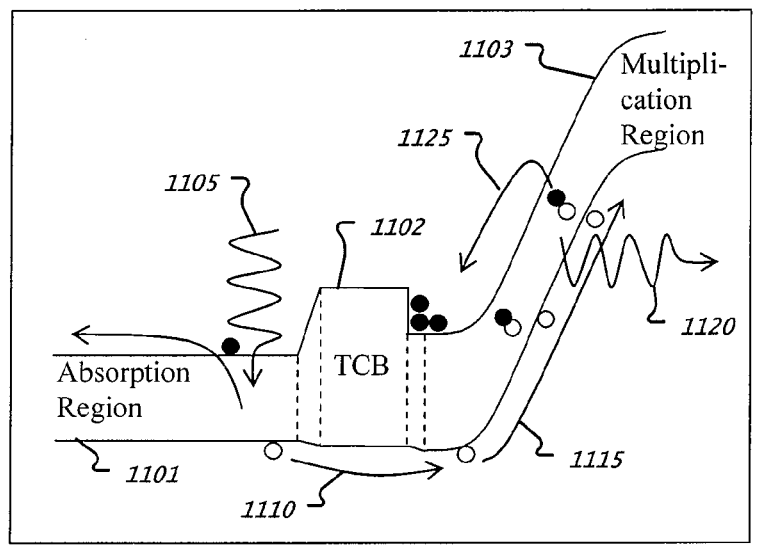
FIG. 11A, 11B, 11C show an example of a sequence of events in a detector device that includes a Transit Carrier Buffer.
Figure 11B:
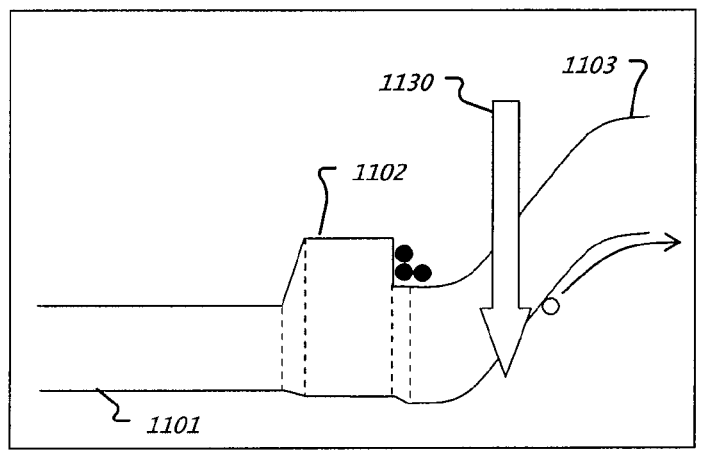
Figure 11C:
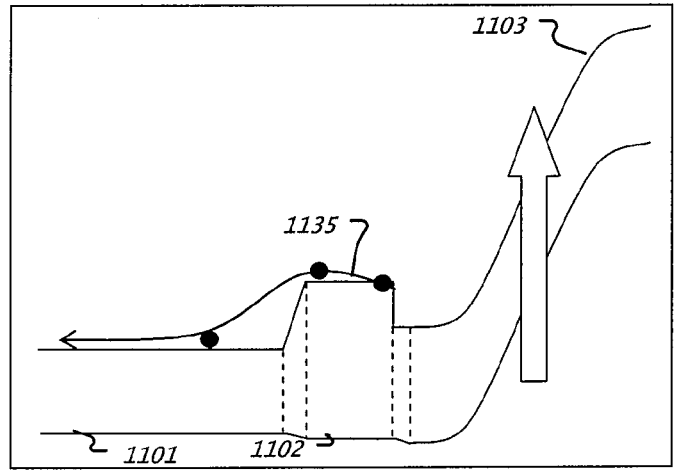

FIG. 11A, 11B, 11C show an example of a sequence of events in a SPAD detector device that includes a Transit Carrier Buffer. In this example, the detector device includes an absorption region 1101, a Transit Carrier Buffer (TCB) 1102, and a multiplication region 1103. The absorption region 1101 absorbs an incident photon 1105 and generates one or more photongenerated carriers. The photongenerated hole 1110 in the absorption region 1101 enters the multiplication region 1103 via the TCB 1102 and can result in an avalanche generation of holes and electrons 1115 in the multiplication region 1103. The recombination of the holes and electrons in the multiplication region 1103 produces high energy photons (1120) as secondary photon emission. The electrons produced in the avalanche process in the multiplication region can collect at the TCB barrier (1125) and this causes the electric field across the multiplication region 1103 to be lowered to stop the avalanche process. This process quenches the avalanche as indicated by the arrow 1130 in FIG. 11B. In turn, electrons collected at the barrier TCB escape the barrier TCB and this condition recovers the device as indicated by the arrow 1135 in FIG. 11C for detecting another incident photon via the avalanche process.

In some implementations, a self-quenching SPAD can include a self quenching layer, such as a TCB, designed by using the band offsets of various epitaxial layers lattice matched to an InP substrate. A region with a high band offset, called a transit carrier buffer (TCB), is placed next to a multiplication region. Carriers generated from the avalanche collect at the interface due to the band offset of the heterojunction between the TCB and the multiplication region, decreasing the electric field through the multiplication region below breakdown in a short time (e.g., <0.1 ns), self-quenching the device. After the avalanche pulse, on a longer time scale (e.g., 10 to 100 ns), the carriers escape from the barrier via thermal excitation and tunneling, self-recovering the device to a ready state for detecting another photon.

A TCB can include a material with a valence band offset next to the p-layer of the multiplication p-i-n to stop holes. In some implementations, a TCB can include material with a conduction band offset next to an n-layer of p-i-n semiconductor layers to stop electrons.

In some implementations, by coupling a negative feedback mechanism with the gain generated from the avalanche process, the current and voltage response of the device can then be simulated in Geiger mode operation, although the DC gain in this mode is infinite.

Referring to FIG. 10B for modeling the self-quenching based on the presence of the TCB barrier between the absorption region at x<0 and the multiplication region, it is assumed that the multiplication region is of a thickness W, and the TCB quenching layer is of thickness L. A single hole is assumed to have reached the interface at x=0 between the multiplication region and the second photon absorption region. This hole is generated through photogeneration in the absorption region at x<0, and drifts to the edge of the multiplication region. Thermal generation within the multiplication region is considered negligible in this calculation due to the higher bandgap of the material.

Upon reaching x=0, additional carriers are generated through impact ionization. A deterministic Selberherr's model is used, with impact ionization dependent only on the local field near the carrier. The ionization rates for electrons and holes are then given by equations (13) and (14), respectively.

$$\alpha(E) = \alpha_0 \exp(-[c_n/E]^{mn}) \qquad (13)$$

$$\beta(E) = \beta_0 \exp(-[c_p/E]^{mp}) \qquad (14)$$

The continuity equations in the multiplication region are $$e \frac{\partial}{\partial t} p(x, t) = -\frac{\partial}{\partial x} J_p(x) + e G_p \qquad (15)$$

$$-e \frac{\partial}{\partial t} n(x, t) = -\frac{\partial}{\partial x} J_n(x) - e G_n \qquad (16)$$

where the generation rates are $G_p = G_n = \beta J_p + \alpha J_n$. The current in the multiplication region is then given by $$\frac{1}{v} \frac{\partial}{\partial t} J_p(x, t) + \frac{\partial}{\partial x} J_p(x, t) = \beta J_p + \alpha J_n \qquad (17)$$

$$\frac{1}{v} \frac{\partial}{\partial t} J_n(x, t) + \frac{\partial}{\partial x} J_n(x, t) = \beta J_p + \alpha J_n \qquad (18)$$

where it is assumed the carriers travel at their saturation velocity due to the high field. The total current is the summation of the particle current and the displacement current:

$$J = J_p(x) + J_n(x) + \frac{\varepsilon}{W} \frac{dV_m}{dt} \qquad (19)$$

where $V_m$ is the voltage across the multiplication region. Since the current J is independent of x, the following equation is derived:

$$\frac{\partial}{\partial x} J = 0 = \frac{\partial}{\partial x} J_p(x) + \frac{\partial}{\partial x} J_n(x) \qquad (20)$$

The voltage applied across the device is assumed to drop only due to the multiplication and TCB regions. Then the voltage across the TCB region is $V_{TCB} = V - V_m$. As the avalanche process builds up, holes are trapped at the TCB interface due to the band discontinuity, forming a sheet charge $Q_i$. The TCB region can be modeled as a leaky capacitor, e.g., a capacitor and resistor in parallel. This would have a time constant τ, which represents the escape time of holes from the interface. The current through the TCB region is then $$J = \frac{\varepsilon}{L\tau}(V - V_m) + \frac{\varepsilon}{L} \frac{d(V - V_m)}{dt} \qquad (21)$$

Using the boundary condition of zero electrons at the end of the multiplication region (e.g., at x=W), with the definitions $T = \tau(1+L/W)$, $A = \beta - \alpha$, and $v = 2(v_p + v_n)$, the above equations can be rearranged into $$\frac{e^{AW} - 1}{A} \frac{T}{v} \frac{d^2 V_{TCB}}{dt^2} + \left(T\left[1 - (e^{AW} - 1)\frac{\alpha}{A}\right] + \frac{e^{AW} - 1}{Av}\right) \qquad (22)$$

$$\frac{dV_{TCB}}{dt} + \left[1 - (e^{AW} - 1)\frac{\alpha}{A}\right] V_{TCB} = \frac{L\tau}{\varepsilon} e^{AW} J_p(0)$$

A numerical solution to equation (22) can be calculated with boundary conditions $V_m = V_{applied}$ and $dV_m/dt = 0$ for t<0. Given an effective cross sectional area S (typically about 100 μm²), a single photon response can be modeled by $$J_p(0,t) = \delta(t) e/S \qquad (23)$$

Unless noted otherwise, calculations are made at a 5% relative overbias, e.g., 105% of the breakdown voltage. The breakdown voltage is determined by setting the multiplication factor to infinity in equation (24), where $k = \beta/\alpha$ and the ionization coefficients are assumed to be position independent in the p-i-n junction.

$$M = \frac{1-k}{\exp(-\alpha W(1-k)) - k} \qquad (24)$$

Figure 12B:
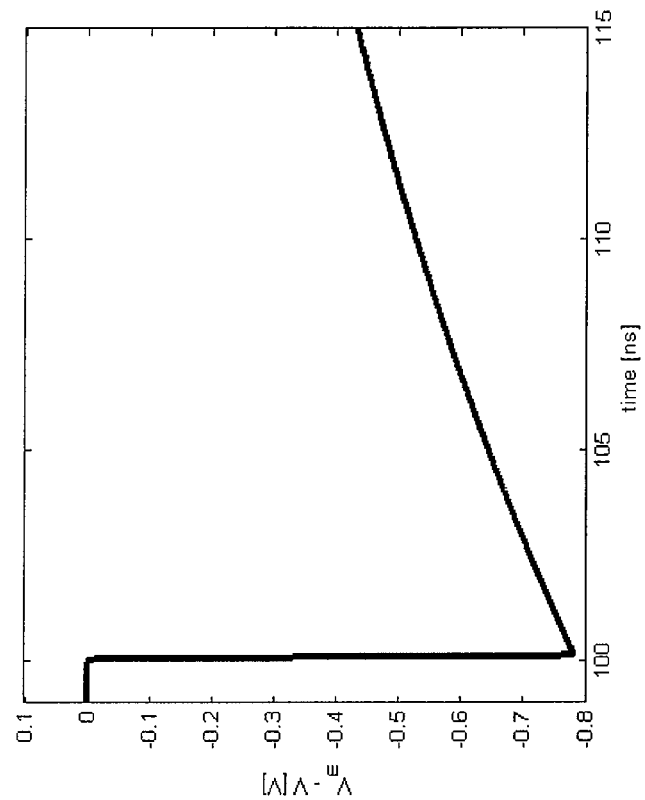
FIGS. 12A and 12B show different response profile examples of a self-quenching, self-recovery SPAD.
Figure 12A:
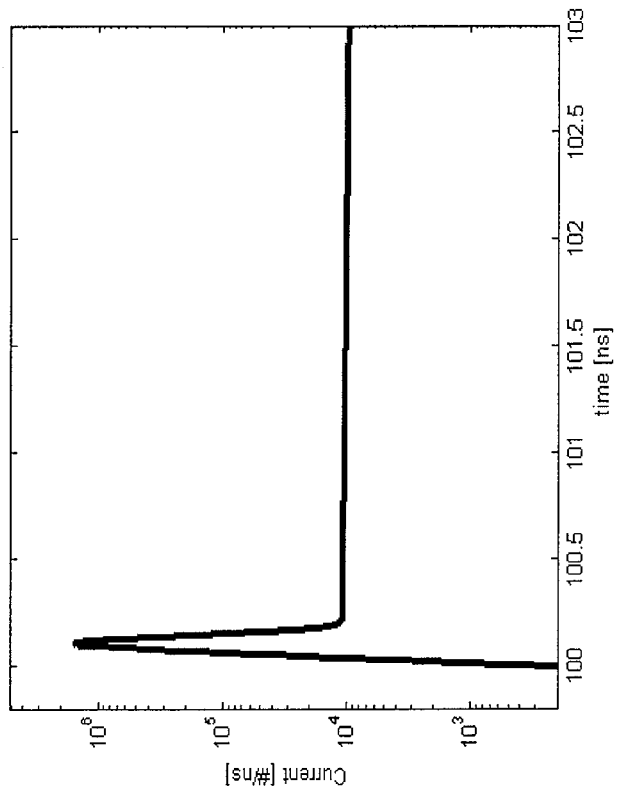

FIGS. 12A and 12B show different response profile examples of a self-quenching, self-recovery SPAD with a structure shown in FIGS. 10A and 10B. FIG. 12A shows a calculated current response due to a single photon at time=100 ns. FIG. 12B shows a voltage response across the multiplication layer of the SPAD. The long discharge time suggests a much longer self-recovery time than the self-quenching time. Biased above the breakdown voltage, a single hole arriving in the multiplication region will trigger the avalanche. The interface charge rapidly accumulates at the TCB, dropping the voltage across the multiplication region, leading to self-quenching of the device. The self-quenching mechanism is dependent on the avalanche build up process and occurs on a very short timescale (e.g., in the order 100 ps). After self-quenching, the avalanche current drops quickly, and the current after the avalanche pulse is due to the discharging of the accumulated interface charge. As the interface charge escapes, the voltage across the TCB region decreases, or the voltage across the multiplication region increases, and the device self-recovers. The self-recovery mechanism is dependent on the hole escape process and occurs on a much longer timescale (>10 ns).

FIGS. 13A, 13B, 13C, 13D show different graphs associated with a self-quenching, self-recovery SPAD. FIG. 13A shows an example of a graph featuring gain versus overbias. FIG. 13B shows an example of a graph featuring quenching time versus overbias. FIG. 13C shows an example of a graph featuring recovery time versus overbias. FIG. 13D shows an example of a graph featuring average dark current level versus applied voltage at various input rates.

The dependence of several device characteristics on the applied bias can be found from the current response of a single photon. The gain is calculated by integrating the current under the avalanche pulse, and is shown to have a linear relationship to the applied bias (e.g., see FIG. 13A). The quenching time is approximated by the full width at half maximum (FWHM) of the avalanche pulse, and is inversely proportional to the applied overbias (e.g., see FIG. 13B). As the applied bias increases, the buildup of interface charges increases faster, thus leading to the faster quenching time. The self-recovery time is defined as the time when a second input will produce a gain of 50% of the first input (e.g., see FIG. 13C). In some implementations, there can be a slight dependence on the applied voltage due to the dependence of the initial gain on the applied voltage; however, this dependence can be weak, and the recovery time can be limited by the intrinsic RC.

The current response to an input photon is strongly dependent on the voltage across the multiplication region. If a secondary photon is introduced before full recovery, the resulting current gain may be less than ideal, and thus the device can have a maximum detection rate depending on the output sensitivity needed.

Figure 14B:
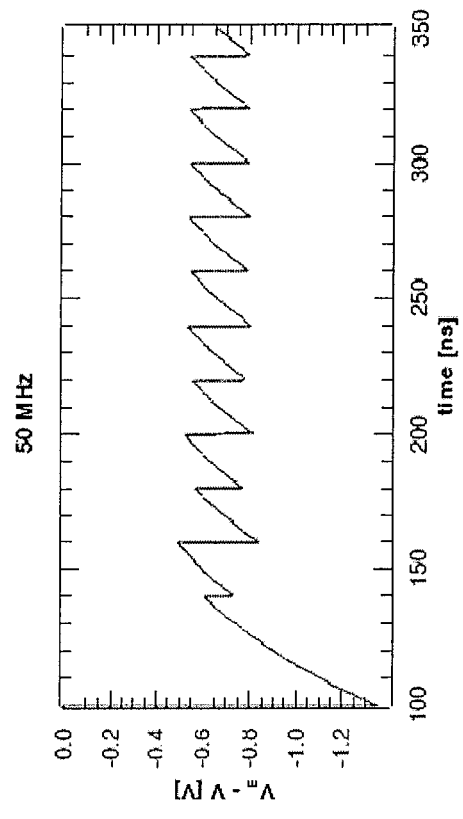
FIGS. 14A, 14B, 14C, and 14D show response examples of a self-quenching, self-recovering SPAD to multiple input photons at various rates.
Figure 14D:
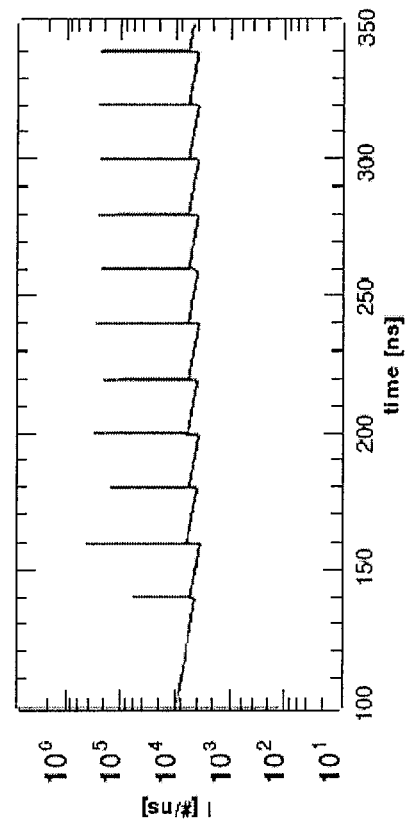
Figure 14A:
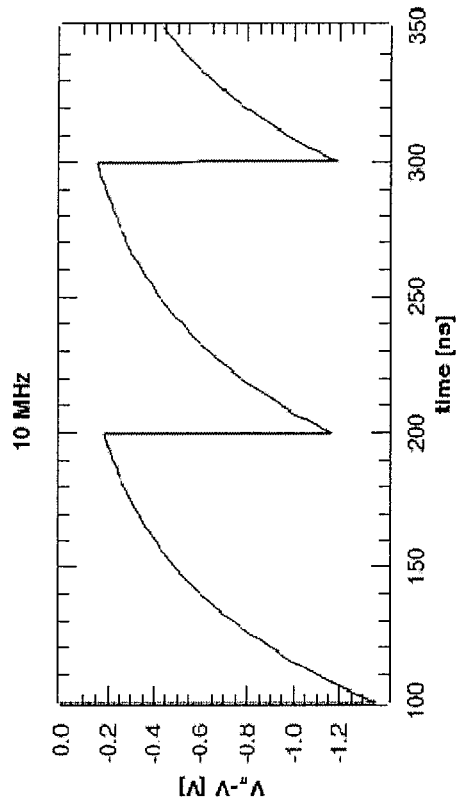
Figure 14C:
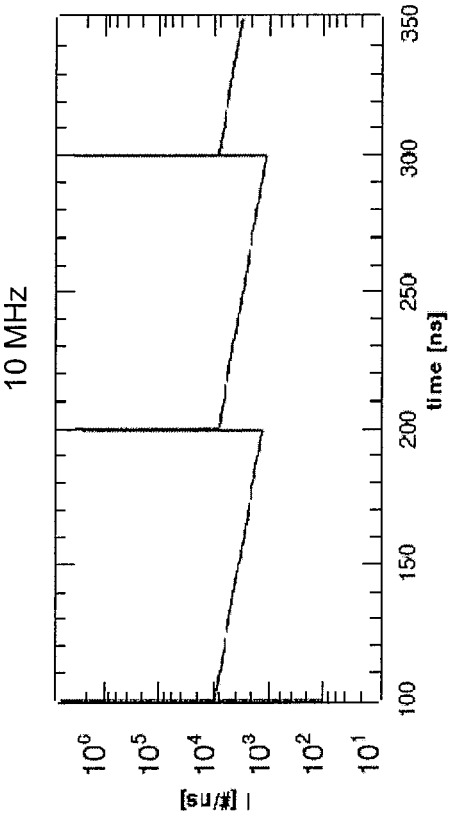

FIGS. 14A, 14B, 14C, and 14D show response examples of a self-quenching and self-recovering SPAD to multiple input photons at various rates. FIG. 14A shows an example of a calculated voltage response due to a photon input rate of 10 MHz. FIG. 14B shows an example of a calculated voltage response due to a photon input rate of 50 MHz. FIG. 14C shows an example of a current response due to a photon input rate of 10 MHz. FIG. 14D shows an example of a current response due to a photon input rate of 50 MHz. Higher input rates lead to less time for recovery, resulting in lower peak current as demonstrated by the figure. Note that at time=120 ns for the 50 MHz (e.g., 5×107 photons/s or 5×107 dark counts/s) case, the voltage across the multiplication region is still below the breakdown voltage, and thus there is little response.

This same setup can also be used to model the dark current levels of the device. If it is assumed dark carriers are generated at a given rate, the dependence of the average current level on the applied bias can be plotted (e.g., see FIG. 13D). While at low rates the average current level is directly proportional to the dark current rate, at high dark current rates the relationship is no longer linear. This is due to device saturation, and each additional input carrier produces little gain.

Figures 15A, 15B:
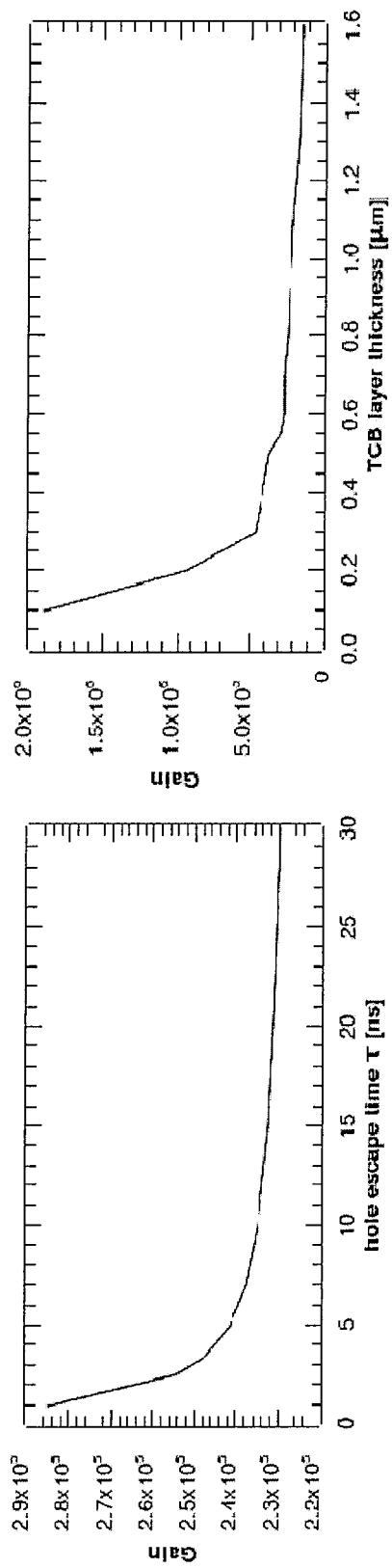
FIG. 15A shows a graph of a relationship between Geiger-mode gain and hole escape time.
FIG. 15B shows an example of a relationship between Geiger-mode gain and TCB layer thickness.

To optimize device characteristics such as gain and recovery time, the variation of the device structure and material parameters is examined. The hole escape time τ, which physically depends on barrier height and thickness, along with the TCB layer thickness L is varied. Longer hole escape times lead to a longer self-recovery time of the device. In some implementations, shorter escape times mean there will be fewer holes trapped at the interface, leading to a longer quenching time. As the device takes longer to quench, the device can remain in a Geiger mode for a longer time, and thus produces a larger gain. FIG. 15A shows a graph of a relationship between Geiger-mode gain and hole escape time.

FIG. 15B shows an example of a relationship between Geiger-mode gain and TCB layer thickness. When the barrier thickness is smaller, its modeled capacitance increases, and thus more charge is required to quench the avalanche, resulting in a larger Geiger-mode gain. In some implementations, varying either L or τ can have similar effects (e.g., see equation (22)).

The modeling of the SPAD with negative feedback shows gain can be increased by increasing the applied overbias, at the cost of increasing dark current. Increasing the applied bias will also benefit key characteristics such as the quenching time. To maximize gain, either the self-quenching barrier height (related to hole escape time) or barrier thickness can be modified. As either is decreased, the infinite gain of a conventional SPAD in Geiger mode is recovered; but doing so diminishes the fast self-quenching property. As gain is much more sensitive to the barrier thickness, a thin and high barrier is preferred to a low and thick barrier.

A detector can include an InGaAs/InAlAs based SPAD to detect single photons at λ=1550 nm, with a quenching layer InGaAsP ($E_g$=1 μm). In such a detector, the resulting valence band offset between an InAlAs multiplication region and a TCB region is around 80 meV.

FIG. 16 shows example of an I-V response of a self-quenching and self-recovering device in the dark and in 1550 nm illumination. Such a device can include an InGaAs/InAlAs based SPAD to detect single photons at λ=1550 nm. The device can include a quenching layer InGaAsP ($E_g$=1 μm). In such a device, the resulting valence band offset between an InAlAs multiplication region and a TCB region is around 80 meV. Due to the presence of the TCB layer, the current does not increase as rapidly near the breakdown voltage compared to conventional SPADs.

The avalanche pulse width is found to be around 30 ns (limited by the electronics rather than the intrinsic response), with a device recovery time of around 300 ns. Due to the self-quenching mechanism, the avalanche pulses can be uniform.

FIG. 17A shows an example of an output pulse height at a bias voltage of 30.4 V. FIG. 17B shows an example of output pulse signals triggered by a series of single photons. As seen in FIGS. 17B and 17B, the average pulse height is 0.76 V, with a standard deviation of 25 meV. The equivalent excess noise factor calculated from the pulse height is 1.001.

Figure 18:
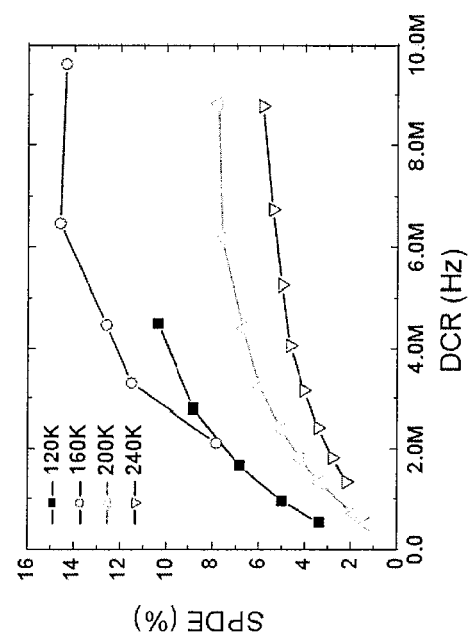
FIG. 18 show an example of different single photon detection efficiencies versus dark current rates at various temperatures.

FIG. 18 show an example of different single photon detection efficiencies versus dark current rates at various temperatures. The decrease in single photon detection efficiencies (SPDE) from 160 K to 120 K is due to the large decrease in the absorption coefficient at 1550 nm wavelength for InGaAs. The decrease in SPDE per given dark current rates (DCR) at higher temperatures can be attributed to less time for recovery between events, leading to more holes still trapped at the interface. This decreases the effective voltage across the multiplication region, leading to smaller gains and SPDE.

Figure 19:
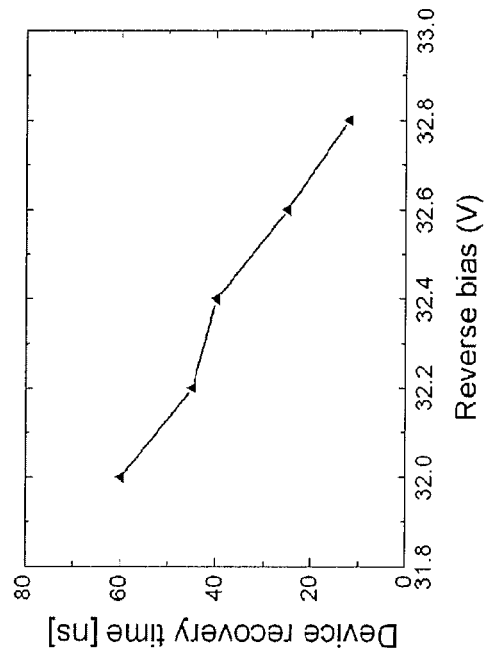
FIG. 19 shows an example of a recovery time profile.

FIG. 19 shows an example of a recovery time profile. The self-recovery time can also be deduced from the correlation measurements. After a triggered pulse, at time intervals less than the recovery time the dark count will be significantly less. The recovery time is defined here as the time at which the avalanche probability recovers to 63% of its normal level. As the reverse bias increases, the device recovery time decreases, which suggests that the hole escaping mechanism for this TCB structure is dominated by field assisted tunneling. Additional measurements from 120 K to 240 K show that the temperature dependence of the self-recovery time is weak.

FIG. 20 shows a cross-section example of a SPAD in a detector device. Such a device can include separate absorption and multiplication structure (SAM), where absorption occurs in an InGaAs layer and multiplication is performed in an InAlAs layer. Such a device can include additional layers for lattice matching and for additional functionality. Different implementations can have more or less layers than those shown in FIG. 20. Different implementations can have different layers than those shown in FIG. 20.

In the SPAD design in FIGS. 10A and 10B, the bandgap of the multiplication region 1015 and the bandgap of the absorption region 1020 for absorbing photon emitted by the multiplication region 1015 are different. At the interface between the regions 1020 and 1015, the bandgap has a step when transitioning between the regions 1010 and 1015. This abrupt step change in the bandgap at the interface reduces the efficiency of the SPAD. One technique to mitigate the reduced detection efficiency caused by the abrupt step change in the bandgap is inserting a semiconductor transition structure that has a spatially graded bandgap between the regions 1020 and 1015. At the interface between the multiplication region 1015 and the first side of the semiconductor transition structure, the semiconductor transition structure exhibits a bandgap that is equal to or similar to the bandgap of the multiplication region 1015. At the other side of the semiconductor transition structure is the interface with the absorption region 1020 and the bandgap of the semiconductor transition structure at this interface is equal to or similar to the bandgap of the absorption region 1020. From the first side to the second side of the semiconductor transition structure, the bandgap spatially varies in a monotonic manner to form a spatially varying ramp. This spatially varying ramp in the bandgap can improve the detection efficiency in comparison with a similarly constructed SPAD device without the semiconductor transition structure.

In some implementations, a detector device can include a semiconductor absorption region structured to absorb photons at a first wavelength to generate one or more charged carriers. The detector device can include a multiplication region structured to receive the one or more charged carriers, the multiplication region structured to generate an avalanche of electrons in response to the one or more charged carriers and emit secondary photons at a second wavelength shorter than the first wavelength. The detector device can include a buffer region structured to impede electrons or holes from the avalanche from passing through the buffer region to cause a reduction in an electric field across the multiplication region to quench the avalanche. The detector device can include a bandgap grading region adjacent to the absorption region, at least a portion of the bandgap grading region having a spatially varying bandgap profile that monotonically changes between a first region that interfaces with the absorption region and a second region.

FIG. 21A shows an example of a SPAD detector device 2100 that includes the semiconductor transition structure made of one or more bandgap grading regions and sandwiched between the multiplication and the absorption region. The detector device 2100 includes an absorption region 2130, a transit carrier buffer region 2115, and a multiplication region 2125. A detector device 2100 includes one or more bandgap grading regions 2135. A bandgap grading region 2135 is designed to exhibit a spatially varying bandgap that changes between successive layers of the bandgap grading region 2135. For example, bandgap grading region 2135 can have a spatially varying bandgap profile that monotonically changes between a first region that interfaces with a multiplication region 2125 and a second region that interfaces with the second absorption region 2130.

FIG. 21B shows an example of an InGaAs/InAlAs SPAD with a built-in quenching mechanism based on the quenching layers and a transition structure between the multiplication region and the absorption region. In this example, the epilayer structure of the self-quenching SPAD includes an buffer region (e.g., multiple quenching layers), multiplication region, a transition region formed of bandgap grading layers and an absorption region. The absorption region includes a 1.5 µm thick InGaAs layer. A multiplication region includes InAlAs p-i-n junction with a 0.2 µm intrinsic region. The bandgap grading layers are grown between an InGaAs absorption region and an InAlAs multiplication region to provide the spatially varying bandgap ramp from the bandgap of the multiplication region and the absorption region. As an example, different bandgap grading layers have different bandgaps that sequentially and monotonically change from one side of the bandgap grading layers to the other side. A quenching layer can include InGaAsP with $E_g=1.0$ µm. An energy barrier is created by the valence band offset between InGaAsP with $E_g=1.0$ µm and InAlAs, which is, for example, 80 meV.

FIGS. 21C and 21D show different bandgap grading region layouts. As shown in FIG. 21C, a detector device layout can position a bandgap grading region 2170 positioned between a multiplication region 2165 and an absorption region 2175. As shown in FIG. 21D, a detector device layout can position a bandgap grading region 2185 between a buffer region 2180 and an absorption region 2190.

Different TCB structures and arrangements can be implemented. Table 1 and Table 2 show different example of detector device structures.

Table 1 shows an example of an epitaxial layer structure of a self-quenching and self-recovering device. An InAlAs layer is placed in between the InP multiplication and InGaAs absorption regions to act as a TCB for electrons. Graded transition layers are placed in between to support the transport of photogenerated holes from InGaAs to InP. The system can be capped with a thin p layer for an ohmic contact.

TABLE 1

| Material | Thickness | Doping | Function |
| --- | --- | --- | --- |
| InGaAsP | 0.1 µm | p = 1e18 | Ohmic contact |
| InP | 0.2 µm | p = 2e17 | Multiplication region |
| InP | 0.8 µm | | Multiplication region |
| InP | 0.25 µm | n = 1e17 | Multiplication region |
| InGaAsP GRIN (1.1 um to InP) | 0.1 µm | | Transition layer |
| InAlAs | 0.8 µm | | TCB |
| InAlGaAs GRIN | 0.3 µm | | Transition layer |
| InGaAs | 1.5 µm | | Absorption layer |
| InP buffer | 0.5 µm | n = 1e17 | |
| InP n substrate | | | |

TABLE 2

| Material | Thickness | Doping | Function |
| --- | --- | --- | --- |
| InGaAsP | 0.1 µm | p = 1e18 | Ohmic contact |
| InP | 0.2 µm | p = 2e17 | Multiplication region |
| InP | 0.8 µm | | Multiplication region |
| InGaAsP GRIN (1.1 um to InP) | 0.1 µm | | Transition layer |
| InAlAs | 0.3 µm | n = 7e16 | TCB |
| InGaAsP (1.1 um) | 0.2 µm | | |
| InAlAs | 0.3 µm | | TCB |
| InAlGaAs GRIN | 0.15 µm | | Transition layer |
| InGaAs | 1.5 µm | | Absorption layer |
| InP buffer | 0.5 µm | n = 1e17 | |
| InP n substrate | | | |

Table 2 shows a different example of an epitaxial layer structure of a self-quenching and self-recovering device. In some implementations, a device can include two or more TCB layers. In some implementations, the field drop can occur across the first TCB barrier.

Figure 22A:
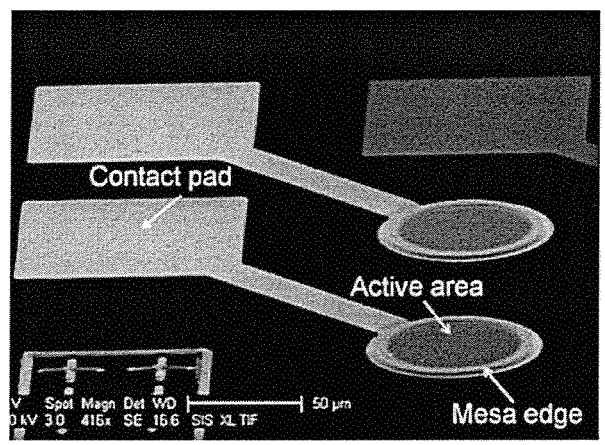
FIGS. 22A, and 22B show different implementation details of an InGaAs/InAlAs SPAD with a built-in quenching mechanism.
Figure 22B:
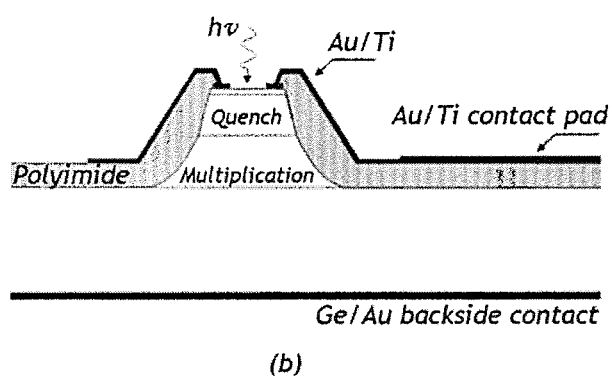

FIGS. 22A and 22B show different implementation examples of an InGaAs/InAlAs SPAD with a built-in quenching mechanism. FIG. 22A shows an example of the SPAD's mesa structure in a top illumination configuration where the top Au—Ti electrode is formed to cover the mesa detector structure while leaving an aperture on the top of the mesa for receiving incident light. On the backside of the detector, a Ge/Au electrode is formed. In operation, a control voltage is applied across the top and backside electrodes to operate the detector. In some implementations, the mesa sidewall is protected by a polyimide passivation layer. FIG. 22B shows a scanning electron microscopy (SEM) micrograph of a fabricated SPAD device. In some implementations, the SPAD can operate in a free-running mode for single photon detection without the need of external quenching circuit.

A detector device can include an InGaAs/InAlAs SPAD for near infrared light detection with build-in self-quenching and self-recovery capabilities. The device can detect light signal down to single photon level at near infrared wavelength. In some implementations, the detector device integrates four functions, photon absorption, avalanche multiplication, avalanche quenching, and device resetting. The build-in self-quenching self-recovery capabilities can enable the device to be operated with a simpler read-out circuit and in sub-Geiger mode, which is in contrast to conventional SPADs Geiger mode operation. In sub-Geiger mode operation, the device is biased at DC voltage. In some implementations, a detector device can include a mechanism, such an electronic circuit, to operate the InGaAs/InAlAs SPAD in a DC condition for sub-Geiger operations. Biasing the detector device at DC voltage can reduce detection system complexity and can minimize the SPAD's dead time. The detector device can achieve high multiplication gain with very low excess noise. The detector device can be configured to count photons for photon number resolving applications. The detector device can have a stable gain versus bias behavior.

An InGaAs/InAlAs SPAD can exhibit a gain saturation behavior, e.g., as increasing the bias, the gain can increase to a certain value, ($\sim 10^5$ to $10^6$), and become saturated. The saturation gain value can be tuned by adjusting the energy barrier height and the quenching layer capacitance. A detection system can use a SPAD with this gain saturation property for increased reliability, and for a lower voltage supply requirement, which, in turn can reduce system cost.

An InGaAs/InAlAs SPAD based on the techniques described in this document can be configured for self-quenching. A self-quenching process can regulate an avalanche multiplication process, in a multiplication region of the SPAD, to achieve high gain (e.g., $10^6$) for single photon detection and in the same time suppress noise to a low level.

In some implementations, a detector device for single photon frequency up-conversion can include an IR SPAD optically coupled with a CMOS SPAD. The photons produced by hot-carrier recombination process in the IR SPAD can be subsequently sensed by the CMOS SPAD to allow for on-die data processing. In some implementations, a CMOS SPAD can detect up-converted, visible photons and can include an on-chip readout circuitry to process the signal. Coupling between the IR and CMOS SPAD can be accomplished using mature wafer-level glass-to-glass fusing technology to increase manufacturing efficiency and to reduce costs when compared to other hetero-integration approaches. In some implementations, the IR SPAD and CMOS SPAD can be fused through a silicon dioxide passivation layer. To achieve up conversion in the detector device, the device can utilize a byproduct of the avalanche process, specifically the spectral component of the electroluminescent photons which is higher than the bandgap of the absorbing material of the detector. The detector device can exhibit low noise, can have a short dead time, can have superior up-conversion efficiencies with low power and can be scalable to large arrays.

Figure 23:
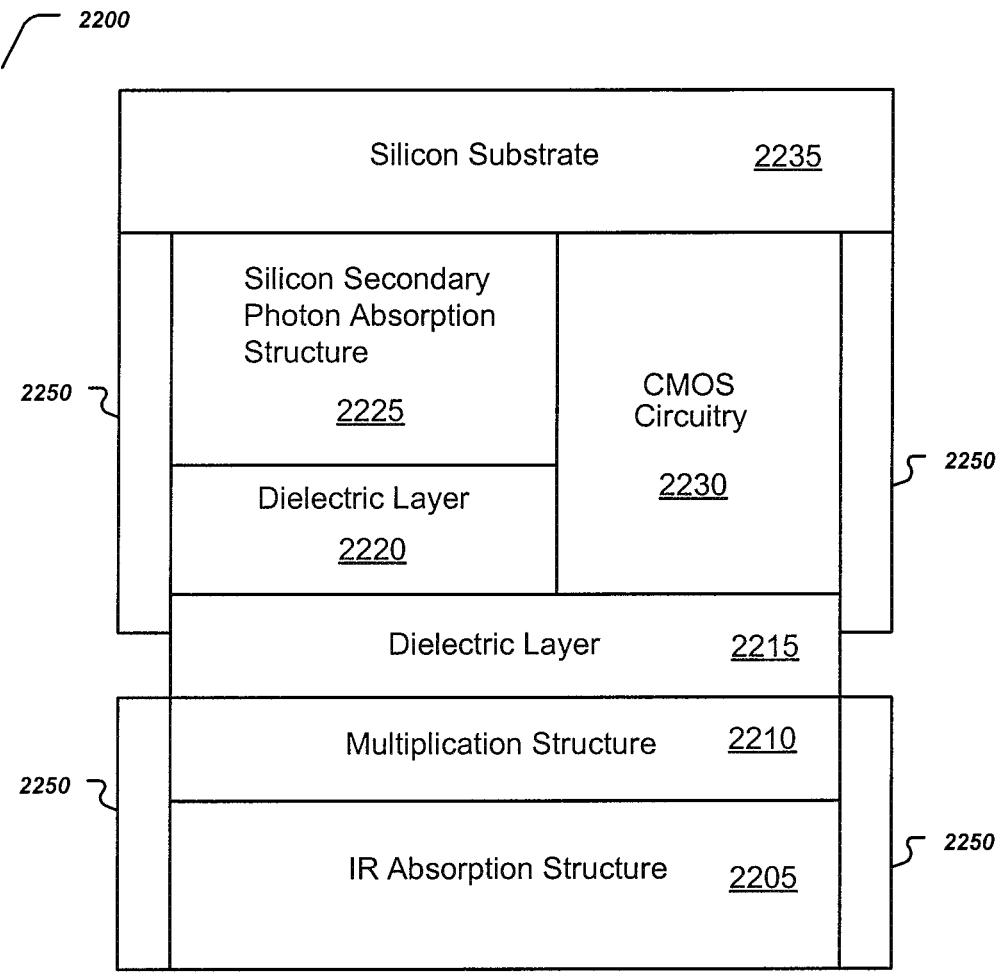
FIG. 23 shows a different cross-section example of a device based on a hot-carrier luminescence effect.

FIG. 23 shows a different cross-section example of a device based on a hot-carrier luminescence effect. A detector device 2200 can include an IR absorption structure 2205, a multiplication structure 2210, one or more dielectric layers 2215, 2220, a silicon secondary photon absorption structure 2225, CMOS circuitry 2230, and a silicon substrate 2235. A silicon secondary photon absorption structure 2225 can include CMOS detection and processing circuitry. In some implementations, a silicon secondary photon absorption structure 2225 can include CMOS circuitry 2230. In some implementations, the device can include one or more isolation structures 2250.

Detector device 2200 can be structured to provide the absorption of IR and multiplication of the carriers to produce light at an optical wavelength shorter than the IR light. The absorption material can be a narrow bandgap IR absorption material and thus can absorb in the IR spectral range. The multiplication material can have a wide bandgap greater than the narrow bandgap to reduce noise. The electroluminescence peaks near the bandgap of the multiplication material's bandgap and thus has higher energy than the absorbed photon. It also has a tail with even higher energies, due to the energy distribution of hot carriers. This is how the upconversion is achieved. Even in materials with the same absorption and multiplication materials, upconversion is possible, due to the above-mentioned tail, but in this case it will be less efficient. Also, if the multiplication material is a direct bandgap material, electroluminescence through hot-carrier recombination can be more efficient.

Figure 24:
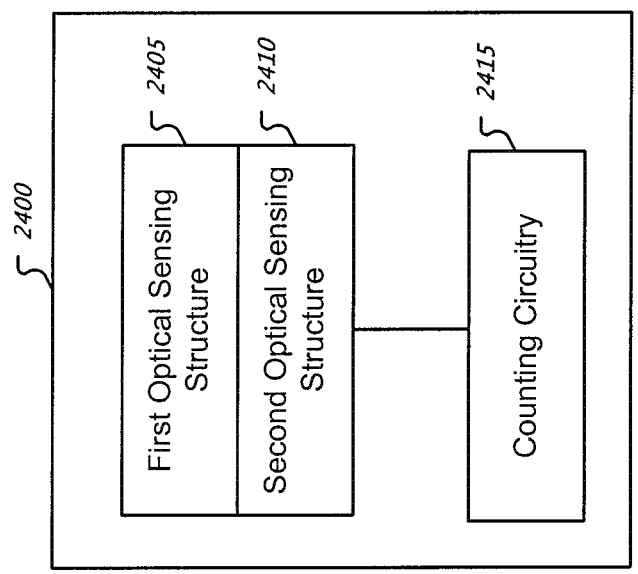
FIG. 24 shows an example of a detector architecture.

FIG. 24 shows an example of a detector architecture. A detector device 2400 can include a first optical sensing structure 2405, a second optical sensing structure 2410, and circuitry such as counting circuitry 2415. In some implementations, one or more optical structures 2405, 2410 can be mounted on a cryostat. Counting circuitry 2415 can receive an output signal from the second optical sensing structure 2410. Counting circuitry 2415 can include a blocking capacitor, amplifier, and a pulse counter. For example, an output signal from the second optical sensing structure 2410 can pass through a blocking capacitor to an amplifier with a voltage gain of, for example, 200 and a bandwidth of, for example, 1 GHz. An output of the amplifier can be connected with a pulse counter to count pulses that correspond to a detected photon.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. However, variations and enhancements of the described implementations and other implementations can be made based on what is described and illustrated.

What is claimed is:
1. A semiconductor radiation sensing device, comprising:
   a semiconductor absorption region structured to absorb photons at a first wavelength to generate one or more charged carriers;

a multiplication region structured to receive the one or more charged carriers, the multiplication region structured to generate an avalanche of electrons in response to the one or more charged carriers and emit secondary photons at a second wavelength shorter than the first wavelength;

a buffer region structured to impede electrons or holes from the avalanche from passing through the buffer region to cause a reduction in an electric field across the multiplication region to quench the avalanche; and a bandgap grading region adjacent to the absorption region, at least a portion of the bandgap grading region having a spatially varying bandgap profile that monotonically changes between a first region that interfaces with the absorption region and a second region.

2. The device as in claim 1, wherein the buffer region is structured to allow electrons to pass through the buffer region to cause an increase in the electric field across the multiplication region to facilitate a recovery from the avalanche.

3. The device as in claim 1, wherein the buffer region is structured to allow holes to pass through the buffer region to cause an increase in the electric field across the multiplication region to facilitate a recovery from the avalanche.

4. The device as in claim 1, wherein the bandgap grading region is positioned between the absorption region and the multiplication region, wherein the second region of the bandgap grading region interfaces with the multiplication region.

5. The device as in claim 1, wherein the bandgap grading region is positioned between the absorption region and the buffer region, wherein the second region of the bandgap grading region interfaces with the buffer region.

6. The device as in claim 1, wherein the buffer region and the multiplication region are structured to create an energy barrier by a valence band offset.

7. The device as in claim 1, further comprising:
a mechanism to bias the second optical sensing structure at a DC voltage.

8. The device as in claim 1, wherein the multiplication region is optically coupled with an optical sensing structure.

9. The device as in claim 1, wherein the buffer region comprises an InAlAs layer.

10. The device as in claim 1, wherein the buffer region comprises an InAlAs, InGaAsP, and InAlAs stack.

11. The device as in claim 1, wherein the bandgap grading region comprises one or more InGaAsP graded index layers.

12. A semiconductor radiation sensing device, comprising:
a semiconductor absorption region structured to receive light at a first wavelength to generate one or more charged carriers by absorbing received light;
a multiplication region structured to receive the one or more charged carriers generated from the semiconductor absorption region and to generate an avalanche of secondary charged carriers in response to the one or more charged carriers and emit secondary photons from the secondary charged carriers;
a region coupled between the absorption region and the multiplication region, the region comprising a mechanism that quenches the avalanche of the multiplication region after occurrence of the avalanche and resets the multiplication region for a next avalanche; and
a semiconductor transition region formed between the multiplication region and the absorption region to have a first bandgap at a first interface with the multiplication region that is equal to or similar to a bandgap of the multiplication region and a second bandgap at a second interface with the absorption region that is equal to or similar to a bandgap of the absorption region, the semiconductor transition region having a spatially varying bandgap between the first and second interfaces to eliminate an abrupt change in bandgap between the multiplication region and the absorption region.

13. The device as in claim 12, wherein the semiconductor transition region comprises a plurality of semiconductor layers that have different bandgaps to form the spatially varying bandgap between the first and second interfaces.

14. A semiconductor radiation sensing device, comprising:
a semiconductor absorption region structured to receive light at a first wavelength to generate one or more charged carriers by absorbing received light;
a multiplication region structured to receive the one or more charged carriers generated from the semiconductor absorption region and to generate an avalanche of secondary charged carriers in response to the one or more charged carriers and emit secondary photons from the secondary charged carriers;
a region coupled between the absorption region and the multiplication region, the region comprising a mechanism that quenches the avalanche of the multiplication region after occurrence of the avalanche and resets the multiplication region for a next avalanche; and
a semiconductor transition region formed between the buffer region and the absorption region to have a first bandgap at a first interface with the buffer region that is equal to or similar to a bandgap of the buffer region and a second bandgap at a second interface with the absorption region that is equal to or similar to a bandgap of the absorption region, the semiconductor transition region having a spatially varying bandgap between the first and second interfaces to eliminate an abrupt change in bandgap between the buffer region and the absorption region.

15. The device as in claim 14, wherein the semiconductor transition region comprises a plurality of semiconductor layers that have different bandgaps to form the spatially varying bandgap between the first and second interfaces.

16. A semiconductor device, comprising:
a first optical sensing structure structured to absorb light at a first optical wavelength; and
a second optical sensing structure engaged with the first optical sensing structure to allow optical communication between the first and the second optical sensing structures, wherein the second optical sensing structure is structured to absorb light at a second optical wavelength longer than the first optical wavelength and to emit light at the first optical wavelength which is absorbed by the first optical sensing structure,
wherein the first optical sensing structure comprises a silicon substrate and is a silicon-based optical detector,
wherein the second optical sensing structure is an IR optical detector which emits light at the first optical wavelength by converting energy in absorbed light at the second optical wavelength via luminescence resulting from hot carrier recombination.

17. The device as in claim 16, further comprising:
a silicon dielectric layer as an interfacing layer formed between the first optical sensing structure and the second optical sensing structure.

18. The device as in claim 16, further comprising:
a complementary metal-oxide-semiconductor (CMOS) circuit to control the first optical sensing structure and the second optical sensing structure.

19. The device as in claim 16, wherein the second optical sensing structure comprises an absorption structure which absorbs light at the second optical wavelength and a multiplication material layer between the absorption structure and the first optical sensing structure to emit light at the first optical wavelength.

20. The device as in claim 19, wherein the absorption structure has a bandgap less than a bandgap of the multiplication structure.

21. The device as in claim 19, wherein the absorption structure has a bandgap similar to a bandgap of the multiplication structure.

22. A semiconductor device, comprising:
a first optical sensing structure structured to absorb light at a first optical wavelength; and
a second optical sensing structure engaged with the first optical sensing structure to allow optical communication between the first and the second optical sensing structures, wherein the second optical sensing structure is structured to absorb light at a second optical wavelength longer than the first optical wavelength and to emit light at the first optical wavelength which is absorbed by the first optical sensing structure,
wherein the second optical sensing structure comprises an absorption structure which absorbs light at the second optical wavelength and a multiplication structure between the absorption structure and the first optical sensing structure to emit light at the first optical wavelength.

23. The device as in claim 22, wherein the absorption structure has a bandgap less than a bandgap of the multiplication structure.

24. The device as in claim 22, wherein the absorption structure has a bandgap similar to a bandgap of the multiplication structure.

25. A semiconductor device, comprising:
a first optical sensing structure structured to absorb light at a first optical wavelength;
a second optical sensing structure engaged with the first optical sensing structure to allow optical communication between the first and the second optical sensing structures, wherein the second optical sensing structure is structured to absorb light at a second optical wavelength longer than the first optical wavelength and to emit light at the first optical wavelength which is absorbed by the first optical sensing structure, and
a dielectric layer interfacing between the first and the second optical sensing structures to permit transmission of light and to fuse the first and the second optical sensing structures together as a single structure.

26. A semiconductor device, comprising:
a first optical sensing structure structured to absorb light at a first optical wavelength; and
a second optical sensing structure engaged with the first optical sensing structure to allow optical communication between the first and the second optical sensing structures, wherein the second optical sensing structure is structured to absorb light at a second optical wavelength longer than the first optical wavelength and to emit light at the first optical wavelength which is absorbed by the first optical sensing structure,
wherein a dead time of the second optical sensing structure overlaps with an avalanche time of the first optical sensing structure to prevent a positive feedback loop between the first and second optical sensing structures.

27. A semiconductor device, comprising:
a first optical sensing structure structured to absorb light at a first optical wavelength; and
a second optical sensing structure engaged with the first optical sensing structure to allow optical communication between the first and the second optical sensing structures, wherein the second optical sensing structure is structured to absorb light at a second optical wavelength longer than the first optical wavelength and to emit light at the first optical wavelength which is absorbed by the first optical sensing structure,
wherein the second optical sensing structure comprises:
an absorption region structured to absorb photons at the second wavelength,
a multiplication region structured to generate an avalanche of electrons in response to an absorbed photon to cause photons to be emitted at the first optical wavelength, and
a buffer region coupled with the multiplication region, and structured to impede electrons or holes from the avalanche from passing through the buffer region to cause a reduction in an electric field across the multiplication region to quench the avalanche, and to allow electrons or holes to pass through the buffer region to cause an increase in the electric field across the multiplication region to facilitate a recovery from the avalanche.

28. The device as in claim 27, further comprising:
a bandgap grading region coupled with the multiplication region, at least a portion of the bandgap grading region having a spatially varying bandgap profile that monotonically changes between a first region that interfaces with the multiplication region and a second region.

29. The device as in claim 27, further comprising:
a bandgap grading region coupled with the buffer region, at least a portion of the bandgap grading region having a spatially varying bandgap profile that monotonically changes between a first region that interfaces with the buffer region and a second region.

30. The device as in claim 27, further comprising:
a mechanism to bias the second optical sensing structure at a DC voltage.

31. The device as in claim 27, wherein the multiplication region is optically coupled with the first optical sensing structure.

32. The device as in claim 27, wherein the buffer region comprises an InAlAs layer.

33. The device as in claim 27, wherein the buffer region comprises an InAlAs, InGaAsP, and InAlAs stack.

34. A semiconductor device, comprising:
a first optical sensing structure structured to absorb light at a first optical wavelength; and
a second optical sensing structure engaged with the first optical sensing structure to allow optical communication between the first and the second optical sensing structures, wherein the second optical sensing structure is structured to absorb light at a second optical wavelength longer than the first optical wavelength and to emit light at the first optical wavelength which is absorbed by the first optical sensing structure,
wherein the first optical sensing structure comprises an array of detector pixels, wherein the second optical sensing structure comprises an array of detector pixels, the device further comprising one or more layers to minimize inter-pixel cross-talk between the first and second optical sensing structures.

* * * * *